(12) United States Patent
Matsuzaki

(10) Patent No.: US 8,885,437 B2
(45) Date of Patent: Nov. 11, 2014

(54) STORAGE DEVICE AND DRIVING METHOD THEREOF

(71) Applicant: Semiconductor Energy Laboratory Co., Ltd., Atsugi (JP)

(72) Inventor: Takanori Matsuzaki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 160 days.

(21) Appl. No.: 13/690,483

(22) Filed: Nov. 30, 2012

(65) Prior Publication Data

US 2013/0141961 A1    Jun. 6, 2013

(30) Foreign Application Priority Data

Dec. 2, 2011 (JP) .................................. 2011-264742

(51) Int. Cl.
| | | |
|---|---|---|
| G11C 8/00 | (2006.01) | |
| G11C 11/24 | (2006.01) | |
| G11C 11/405 | (2006.01) | |
| G11C 7/12 | (2006.01) | |
| G11C 11/403 | (2006.01) | |
| H01L 27/108 | (2006.01) | |
| H01L 27/115 | (2006.01) | |
| G11C 16/04 | (2006.01) | |
| H01L 27/12 | (2006.01) | |

(52) U.S. Cl.
CPC .............. *G11C 11/24* (2013.01); *G11C 11/405* (2013.01); *G11C 7/12* (2013.01); *G11C 11/403* (2013.01); *G11C 16/0433* (2013.01); *H01L 27/1225* (2013.01); *H01L 27/108* (2013.01); *H01L 27/1156* (2013.01)

USPC ................................. 365/230.03; 365/189.09

(58) Field of Classification Search
USPC .......................... 365/230.03, 189.09, 189.011
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Vu Le
(74) *Attorney, Agent, or Firm* — Fish & Richardson P.C.

(57) ABSTRACT

An object is to provide a highly integrated storage device which can operate at high speed and a driving method thereof. The storage device includes two storage portions, two precharge switches, and one sense amplifier. In each of the storage portions, storage elements are arranged in a matrix. In each of the storage elements, a node electrically connected to a source or a drain of a transistor whose off-state current is small is a memory storing portion. A page buffer circuit is unnecessary; thus, high-speed operation is possible and high integration is achieved.

25 Claims, 18 Drawing Sheets

(56) References Cited

U.S. PATENT DOCUMENTS

| | | | |
|---|---|---|---|
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0174533 | A1* | 9/2003 | Ito .................................. 365/149 |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0198593 | A1 | 8/2011 | Kato et al. |
| 2012/0033487 | A1 | 2/2012 | Inoue et al. |
| 2012/0051116 | A1 | 3/2012 | Inoue et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

(56) References Cited

OTHER PUBLICATIONS

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID DIgest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214TH ECS Meeting, 2008, No. 2317, 1 page.

Kimizuka, N. et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID

(56) References Cited

OTHER PUBLICATIONS

Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide in InGaO3(ZnO)m (m<4): a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide. Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

FIG. 2A1
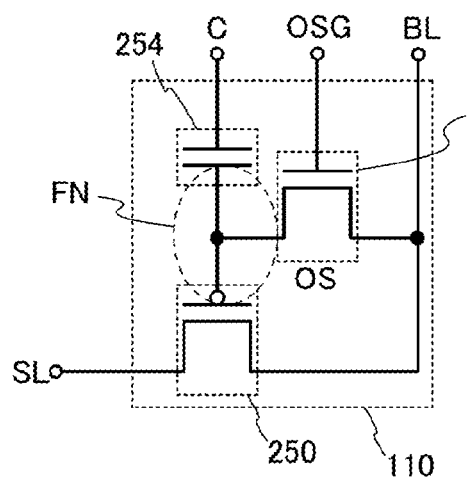
FIG. 2B
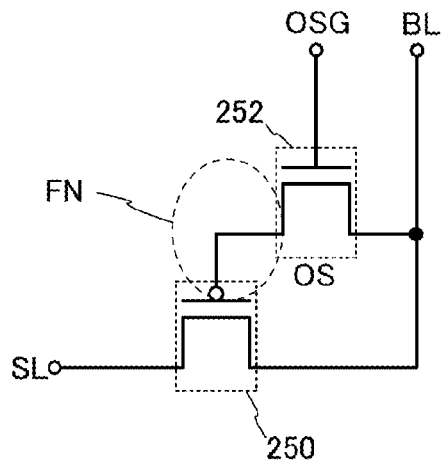
FIG. 2A2
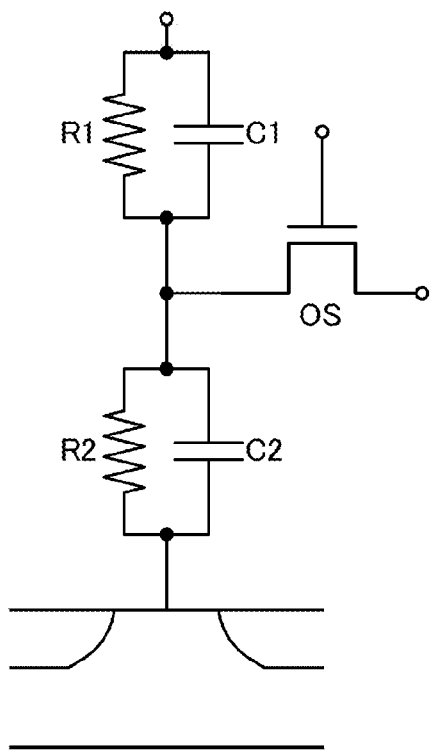

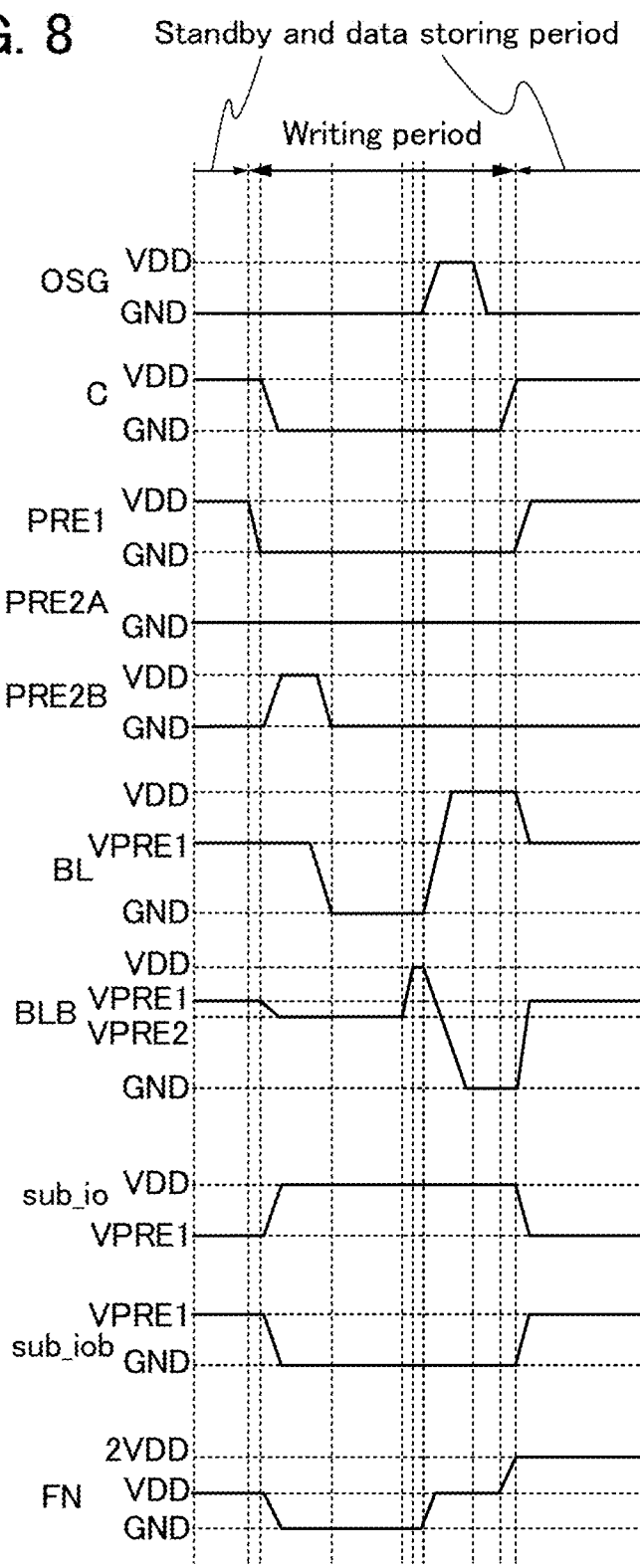

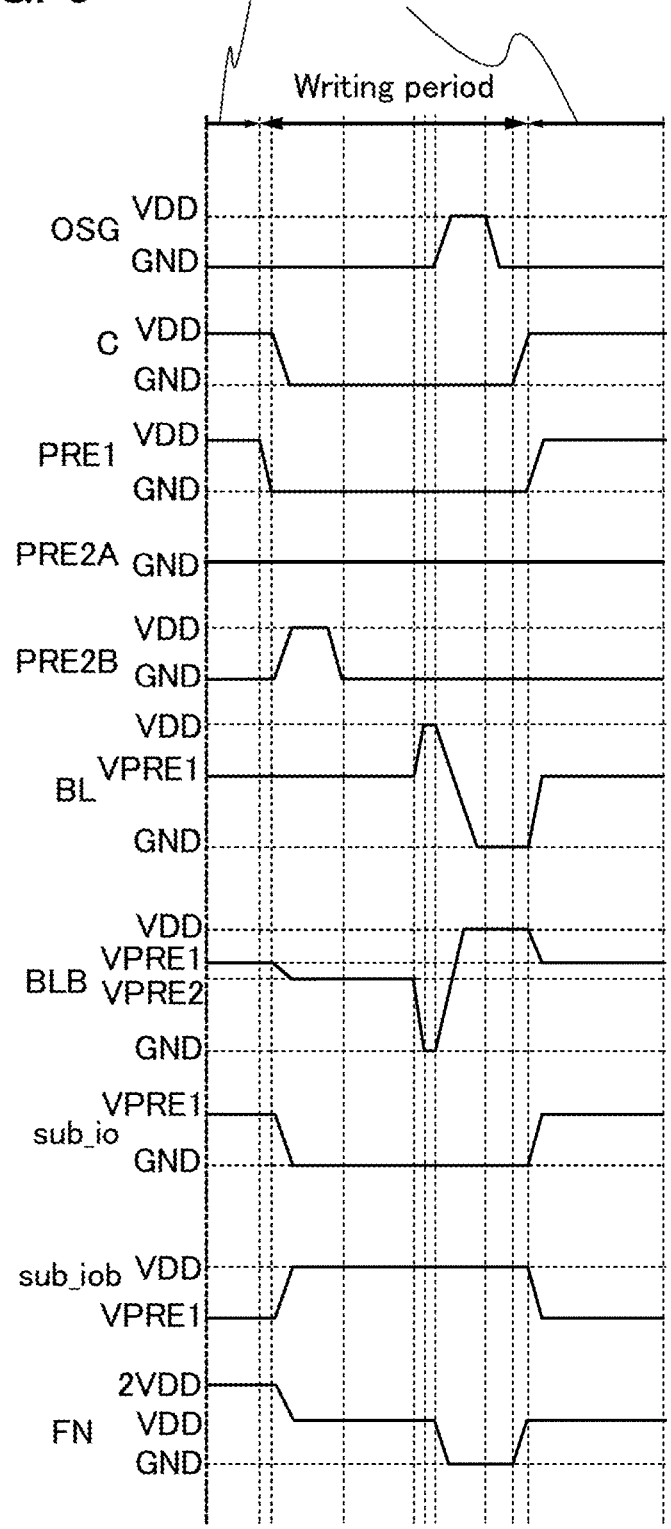

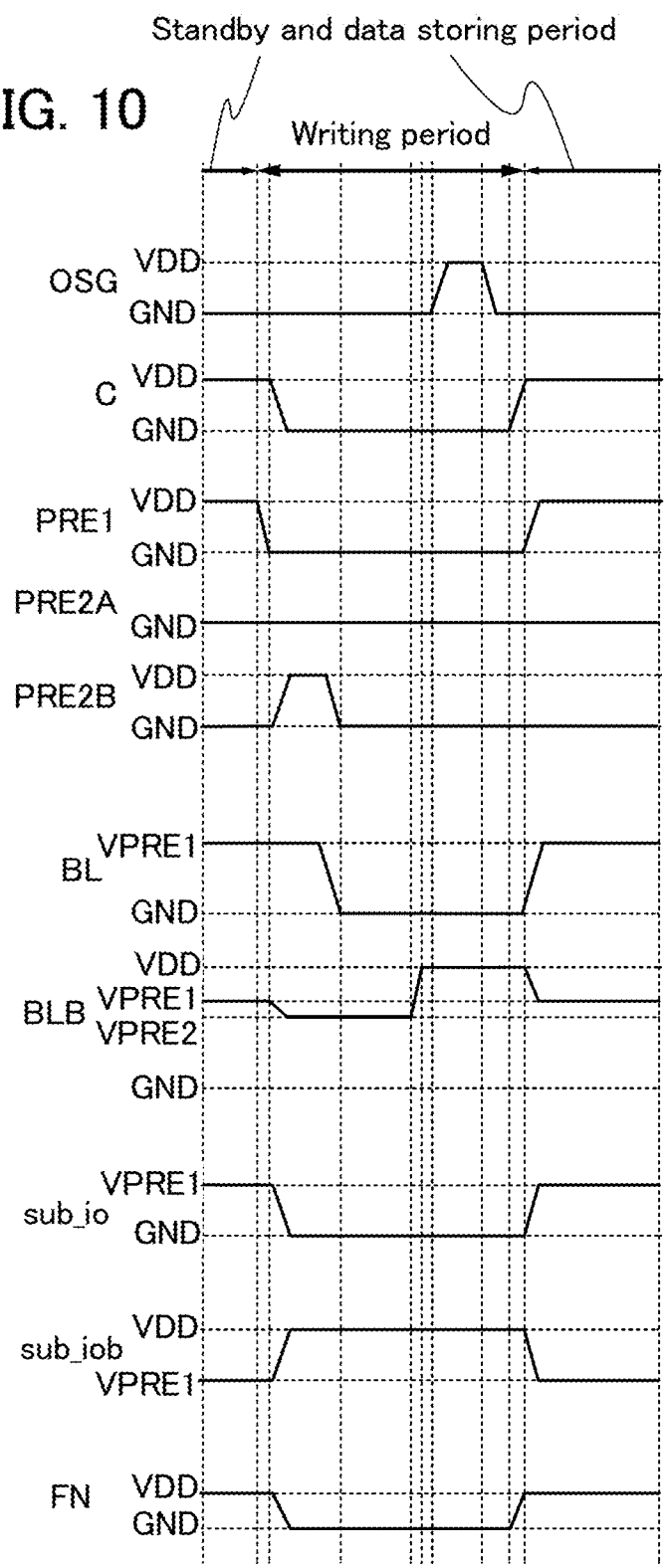

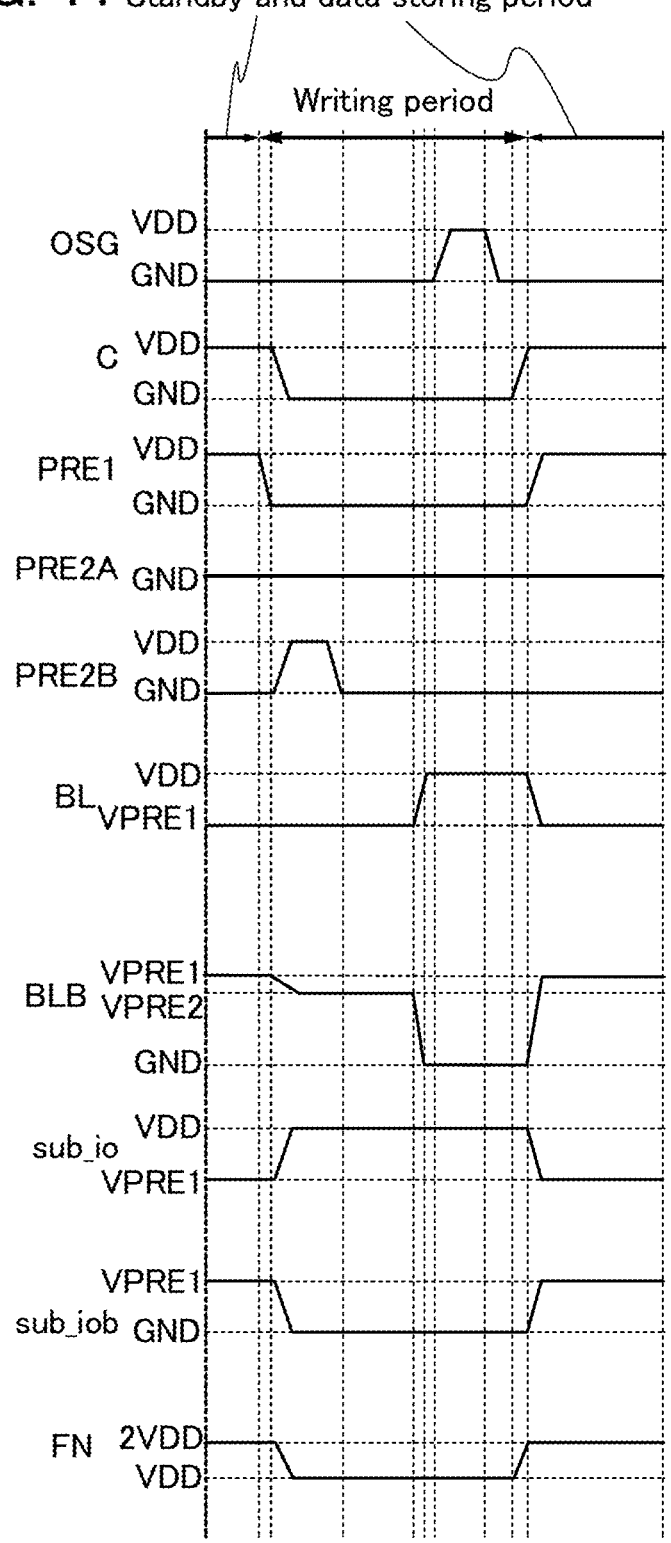

STORAGE DEVICE AND DRIVING METHOD THEREOF

BACKGROUND OF THE INVENTION

1. Field of the Invention

The invention disclosed in this specification and the like relates to a storage device and a driving method of the storage device.

2. Description of the Related Art

As one kind of volatile memories, a dynamic random access memory (DRAM) is widely known.

Meanwhile, in recent years, a metal oxide having semiconductor characteristics (hereinafter referred to as an oxide semiconductor) has attracted attention. An oxide semiconductor can be used for a transistor (see Patent Documents 1 and 2).

[Reference]
[Patent Document 1] Japanese Published Patent Application No. 2007-123861
[Patent Document 2] Japanese Published Patent Application No. 2007-096055

SUMMARY OF THE INVENTION

One embodiment of the present invention is to provide a highly integrated storage device which can operate at high speed.

One embodiment of the present invention is a driving method of a storage device including a first storage portion and a second storage portion. In the first storage portion, memory cells each including a first transistor, a second transistor with a small off-state current, and a capacitor are arranged in a matrix. One of a source and a drain of the first transistor is electrically connected to a first bit line, and the other of the source and the drain of the first transistor is electrically connected to a source line. One of a source and a drain of the second transistor is electrically connected to a memory storing portion and a gate of the first transistor, and the other of the source and the drain of the second transistor is electrically connected to the first bit line. One terminal of the capacitor is electrically connected to the one of the source and the drain of the second transistor and the gate of the first transistor. In the second storage portion, a second bit line is provided instead of the first bit line in the first storage portion. The driving method of the storage device includes steps of setting the potential of the source line to a first potential; setting the potential of the first bit line to a second potential and then electrically isolating the first bit line; setting the potential of the other terminal of the capacitor to a third potential; changing the potential of the other terminal of the capacitor from the third potential to a fourth potential so that the potential of the first bit line is made to be the first potential or the second potential; setting the potential of the second bit line to a fifth potential lower than the second potential; changing the potential of the first bit line to a sixth potential or a seventh potential in accordance with the potential of the first bit line; and controlling a switch provided between the first bit line and an input-output line to selectively read out data of the first bit line, whereby data in the memory storing portion is selectively read out.

In the driving method of the above embodiment, the sixth potential is preferably higher than the second potential, and the seventh potential is preferably equal to or lower than the first potential.

In the driving method of the above embodiment, the first potential, the fourth potential, and the seventh potential are preferably equal to one another, the third potential is preferably equal to the sixth potential, and the second potential is preferably higher than the first potential and lower than the third potential.

In the driving method of the above embodiment, the first potential is preferably a ground potential, and the third potential is preferably a power supply potential.

One embodiment of the present invention is a driving method of a storage device including a first storage portion and a second storage portion. In the first storage portion, memory cells each including a first transistor, a second transistor with a small off-state current, and a capacitor are arranged in a matrix. One of a source and a drain of the first transistor is electrically connected to a first bit line, and the other of the source and the drain of the first transistor is electrically connected to a source line. One of a source and a drain of the second transistor is electrically connected to a memory storing portion and a gate of the first transistor, and the other of the source and the drain of the second transistor is electrically connected to the first bit line. One terminal of the capacitor is electrically connected to the one of the source and the drain of the second transistor and the gate of the first transistor. In the second storage portion, a second bit line is provided instead of the first bit line in the first storage portion. The driving method of the storage device includes steps of setting the potential of the source line to a first potential; setting the potential of the first bit line to a second potential and then electrically isolating the first bit line; setting the potential of the other terminal of the capacitor to a third potential; changing the potential of the other terminal of the capacitor from the third potential to a fourth potential so that the potential of the first bit line is made to be the first potential or the second potential; the potential of a second bit line is set to a fifth potential lower than the second potential; controlling a switch provided between the first bit line and an input-output line to select the first bit line and set the potential of the selected first bit line to a sixth potential or a seventh potential, whereby data is written to the memory storing portion; and turning off the second transistor to selectively write data to the memory storing portion.

In the driving method of the above embodiment, the sixth potential is preferably higher than the second potential, and the seventh potential is preferably equal to or lower than the first potential.

In the driving method of the above embodiment, the first potential, the fourth potential, and the seventh potential are preferably equal to one another, the third potential is preferably equal to the sixth potential, and the second potential is preferably higher than the first potential and lower than the third potential.

In the driving method of the above embodiment, the first potential is preferably a ground potential, and the third potential is preferably a power supply potential.

In performing the driving method of the storage device, the off-state current of the second transistor is preferably 100 zA or less at 25° C.

One embodiment of the present invention is a storage device including a first storage portion, a second storage portion, a first switch, a second switch, a first driver circuit, and a second driver circuit. In each of the first storage portion and the second storage portion, a plurality of storage elements is arranged in a matrix. The first storage portion is electrically connected to the first switch. The second storage portion is electrically connected to the second switch. The first driver circuit includes two precharge switches and one sense amplifier. In each of the plurality of storage elements, a node electrically connected to a source a drain of a transistor whose off-state current is 100 zA or less at 25° C. is a memory storing portion. That is to say, in the storage device of one embodiment of the present invention, a page buffer circuit is not provided, and data in the memory storing portion is stored by writing back the data to the bit line BL in a non-selected column.

In the storage device of the above embodiment, the transistor with a small off-state current may be formed using an oxide semiconductor.

In the storage device of the above embodiment, each of the plurality of storage elements may include a transistor whose gate is electrically connected to the node and which can operate at high speed.

In the storage device of the above embodiment, the transistor which can operate at high speed is preferably formed using single crystal silicon.

A highly integrated storage device which can operate at high speed can be provided.

BRIEF DESCRIPTION OF THE DRAWINGS

In the accompanying drawings:

FIGS. 2A1, 2A2, and 2B illustrate a storage element of a storage device of one embodiment of the present invention;

FIG. 8 shows the operation of a storage device of one embodiment of the present invention;

FIG. 9 shows the operation of a storage device of one embodiment of the present invention;

FIG. 10 shows the operation of a storage device of one embodiment of the present invention;

FIG. 11 shows the operation of a storage device of one embodiment of the present invention;

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the descriptions of the embodiments below.

(Embodiment 1)

In this embodiment, the configuration and operation of a storage device of one embodiment of the present invention will be described.

Figure 1:
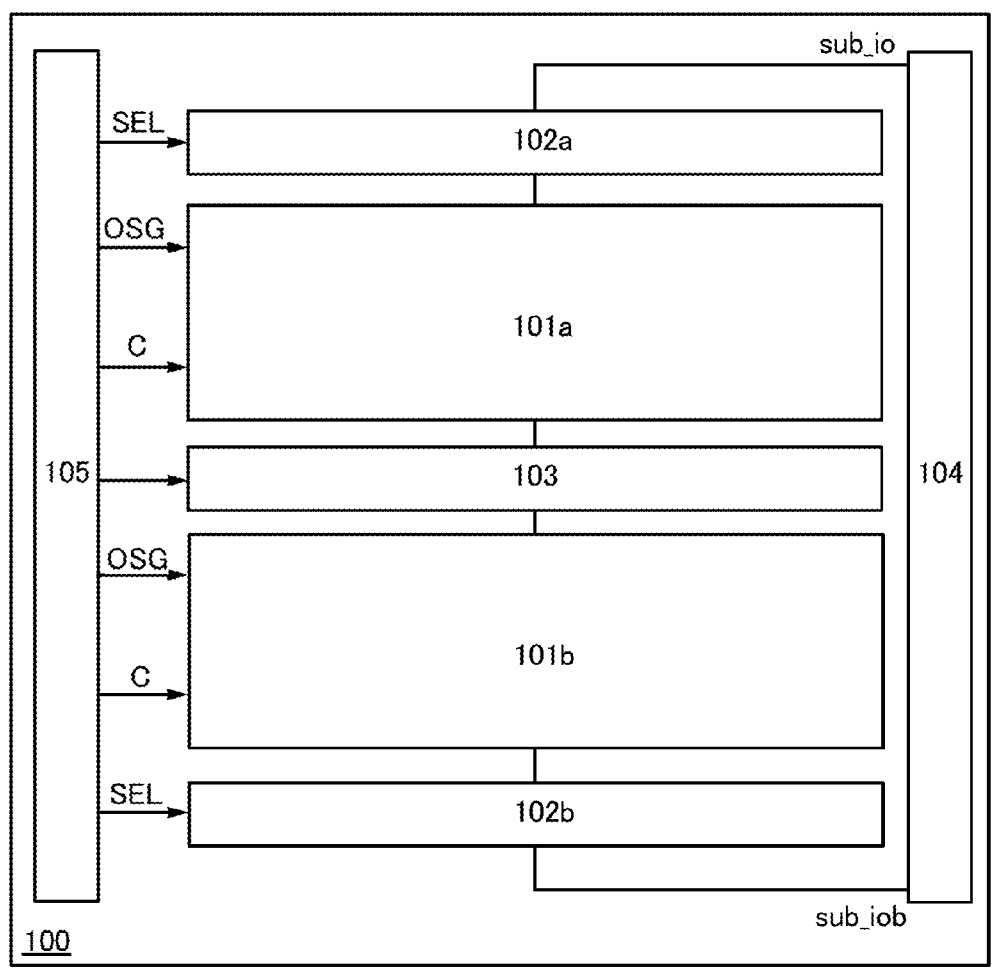
FIG. 1 illustrates a storage device of one embodiment of the present invention.

FIG. 1 illustrates the configuration of the storage device of one embodiment of the present invention. The storage device 100 in FIG. 1 includes a first storage portion 101a, a second storage portion 101b, a first switch 102a electrically connected to the first storage portion 101a, a second switch 102b electrically connected to the second storage portion 101b, a first driver circuit 103 electrically connected to both the first storage portion 101a and the second storage portion 101b, a second driver circuit 104 electrically connected to both the first switch 102a and the second switch 102b, and a third driver circuit 105 electrically connected to the first storage portion 101a, the second storage portion 101b, the first switch 102a, the second switch 102b, and the first driver circuit 103.

The first storage portion 101a and the second storage portion 101b each include a plurality of storage elements arranged in a matrix. The plurality of storage elements arranged in a matrix in the first storage portion 101a and the second storage portion 101b will be described with reference to FIGS. 2A1, 2A2, and 2B.

A storage element in FIG. 2A1 includes a first transistor 250, a second transistor 252, and a capacitor 254. One of a source and a drain of the first transistor 250 is electrically connected to a source line SL, and the other of the source and the drain of the first transistor 250 is electrically connected to a bit line BL. One of a source and a drain of the second transistor 252 is electrically connected to the bit line BL, and a gate of the second transistor 252 is electrically connected to a write word line OSG. One electrode of the capacitor 254 is electrically connected to a write-read word line C.

A gate of the first transistor 250, the other of the source and the drain of the second transistor 252, and the other electrode of the capacitor 254 are electrically connected to each other. A memory storing portion (hereinafter referred to as a node FN) is formed in a portion where they are connected.

Although not illustrated, a plurality of bit lines may be provided and the other of the source and the drain of the first transistor 250 and the one of the source and the drain of the second transistor 252 may be connected to different wirings (different bit lines).

Here, a transistor with a significantly small off-state current is used as the second transistor 252. As the transistor with a significantly small off-state current, a transistor formed using an oxide semiconductor, which is described later, can be used for example; however, one embodiment of the present invention is not limited thereto. Owing to the significantly small off-state current of the second transistor 252, the potential of the node FN can be held for a long time after the second transistor 252 is turned off.

The use of an oxide semiconductor for the second transistor 252 allows the off-state current of the second transistor 252 to be less than or equal to one hundred-thousandth that of a transistor formed using a silicon semiconductor. Thus, electric charge lost from the node FN due to leakage between the source and the drain of the second transistor 252 is negligibly small. That is to say, the use of an oxide semiconductor for the second transistor 252 permits storing of electric charge at the node FN without power supply, and thus, a nonvolatile storage device can be provided.

For example, when the off-state current of the second transistor 252 is 10 zA or less at room temperature (25° C.) and the capacitance of the capacitor 254 is approximately 10 fF, data can be stored for $10^4$ seconds or longer.

Further, the capacitor 254 helps store electric charge at the node FN and read out the stored data.

As the first transistor 250, a transistor with a high switching rate is preferably used. As an example of the first transistor 250, a transistor formed using single crystal silicon can be given. The use of such a transistor with a high switching rate as the first transistor 250 enables high-speed data reading. In this embodiment, a p-channel transistor is used as the first transistor 250.

Note that the capacitor 254 does not necessarily have to be provided (FIG. 2B).

Next, the operation of writing data to the storage element illustrated in FIG. 2A1 and storing the data will be described.

First, the potential of the write word line OSG is controlled to turn on the second transistor 252. Accordingly, a given electric charge is applied from the bit line BL to the node FN (writing). Here, one of two kinds of electric charges providing different potentials (hereinafter, an electric charge providing a low potential is referred to as electric charge $Q_L$ and an electric charge providing a high potential is referred to as electric charge $Q_H$) is applied.

After that, the potential of the write word line OSG is controlled to turn off the second transistor 252, so that the electric charge is stored at the node FN (storing).

Note that the different potentials of the electric charges applied to the node FN are not limited to two kinds of potentials and may be three or more kinds of potentials. In other words, data to be stored in the storage element in FIG. 2A1 is not limited to binary data and may be multilevel data. When data stored in the storage element is multilevel data, the storage capacity per unit area can be increased.

Next, a description will be given of the operation of reading out data in the storage element in FIG. 2A1.

When a read-out potential is supplied to the write-read word line C with the source line SL supplied with a constant potential, the potential depending on the amount of electric charge stored at the node FN is supplied to the bit line BL. That is, the conductance of the first transistor 250 depends on the electric charge stored at the node FN.

In general, when the first transistor 250 is a p-channel transistor, an apparent threshold voltage $V_{th\_H}$ in the case where the electric charge $Q_H$ is applied to the gate of the first transistor 250 is lower than an apparent threshold voltage $V_{th\_L}$ in the case where the electric charge $Q_L$ is applied to the gate of the first transistor 250. For example, in the case where the electric charge $Q_L$ is applied to the node FN by data writing, the first transistor 250 is turned on by applying $V_0$ (a potential intermediate between $V_{th\_H}$ and $V_{th\_L}$) to the write-read word line C. In the case where the electric charge $Q_H$ is applied to the node FN by data writing, the first transistor 250 remains off even by applying $V_0$ to the write-read word line C. Thus, the potential of the bit line BL can be read out as the stored data.

Next, the operation of rewriting data in the storage element illustrated in FIG. 2A1 will be described.

In rewriting data, the potential of the write word line OSG is controlled to turn on the second transistor 252. Accordingly, the electric charge of data to be rewritten is applied from the bit line BL to the node FN. After that, the potential of the write word line OSG is controlled to turn off the second transistor 252, so that the electric charge of the rewritten data is stored at the node FN.

In the above manner, writing, storing, reading, and rewriting of data can be performed.

Unlike a flash memory, which operates by extraction of electric charge from a floating gate, the storage element in FIG. 2A1 does not have to have a floating gate; thus, a reduction in operation speed due to erasing operation can be prevented, and high-speed operation is achieved.

Further, since the storage element in FIG. 2A1 does not have a floating gate unlike a flash memory, a problem of the deterioration of a tunneling insulating layer due to injection of electrons into a floating gate does not occur. Therefore, there is no limitation on the number of writing operations. Furthermore, a high potential needed for writing and erasing in a conventional flash memory is also unnecessary.

The storage element in FIG. 2A1 can also be illustrated as in FIG. 2A2. Note that $R_1$ denotes the resistance of the capacitor 254 and corresponds to the resistance of an insulating layer included in the capacitor 254; $C_1$ denotes the capacitance of the capacitor 254; $R_2$ denotes the resistance of the first transistor 250 and corresponds to the resistance of a gate insulating layer at the time when the first transistor 250 is turned on; and $C_2$ denotes the capacitance of the first transistor 250 and corresponds to the gate capacitance (the capacitance between the gate and the source or between the gate and the drain and the capacitance between the gate and a channel formation region).

An electric charge storing period is determined mainly by the off-state current (the current flowing between the source and the drain in an off state) of the second transistor 252 under the conditions where the gate leakage current (the current flowing between the gate and the source or between the gate and the drain) of the second transistor 252 is sufficiently small and $R_1 \geq R_{OS}$ and $R_2 \geq R_{OS}$ are satisfied, where $R_{OS}$ is the resistance (effective resistance) between the source and the drain in a state where the second transistor 252 is off.

In the case where $R_1 \geq R_{OS}$ and $R_2 \geq R_{OS}$ are not satisfied, it is difficult to secure a sufficiently long electric charge storing period even if the off-state current of the second transistor 252 is sufficiently small. This is because leakage current other than the off-state current of the second transistor 252 (e.g., leakage current generated between the source and the gate) is large. For this reason, to secure a sufficiently long electric charge storing period, it is preferable that $R_1 \geq R_{OS}$ and $R_2 \geq R_{OS}$ be satisfied.

Meanwhile, it is preferable that $C_1 \geq C_2$ be satisfied. This is because when $C_1$ is large, the difference in potential supplied to the read-write word line C (e.g., the difference between the potential at the time when data is read out and the potential at the time when data is not read out) can be small.

Note that the resistance $R_1$ and $R_2$ and the capacitance $C_1$ and $C_2$ are determined depending on the gate insulating layer of the first transistor 250 and the insulating layer of the capacitor.

In the case of a conventional flash memory, a control gate is at a high potential in operation; thus, it is necessary to keep a proper distance between cells in order to prevent malfunctions of the adjacent cells, which is disadvantageous for high integration. In the case of the storage element in FIG. 2A1, such a high potential is unnecessary, which facilitates high integration. Further, a booster circuit for generating a high potential is not required.

Figure 3A:
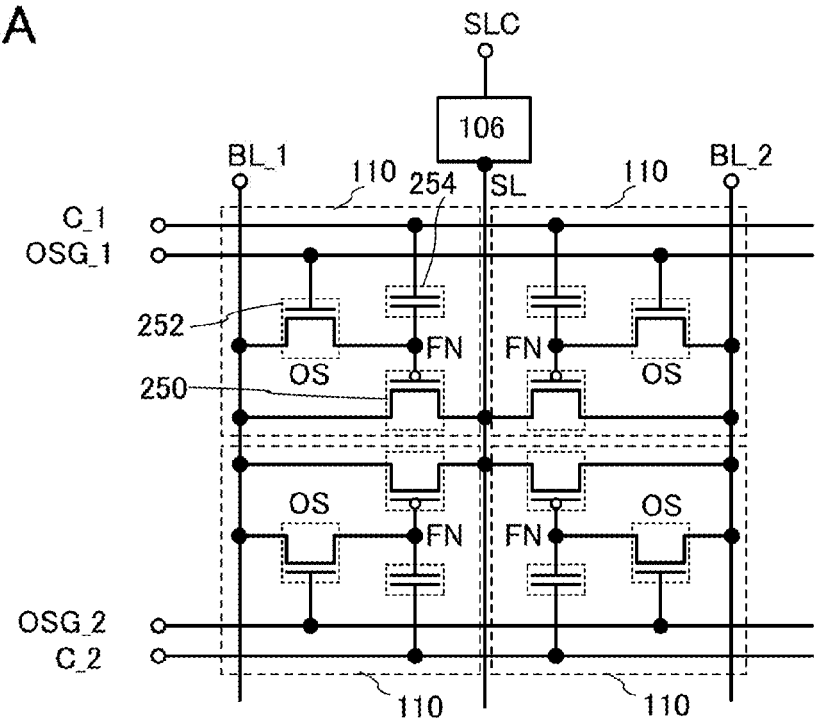
FIGS. 3A and 3B are diagrams of circuits each having the storage elements in FIGS. 2A1, 2A2, and 2B.
Figure 3B:
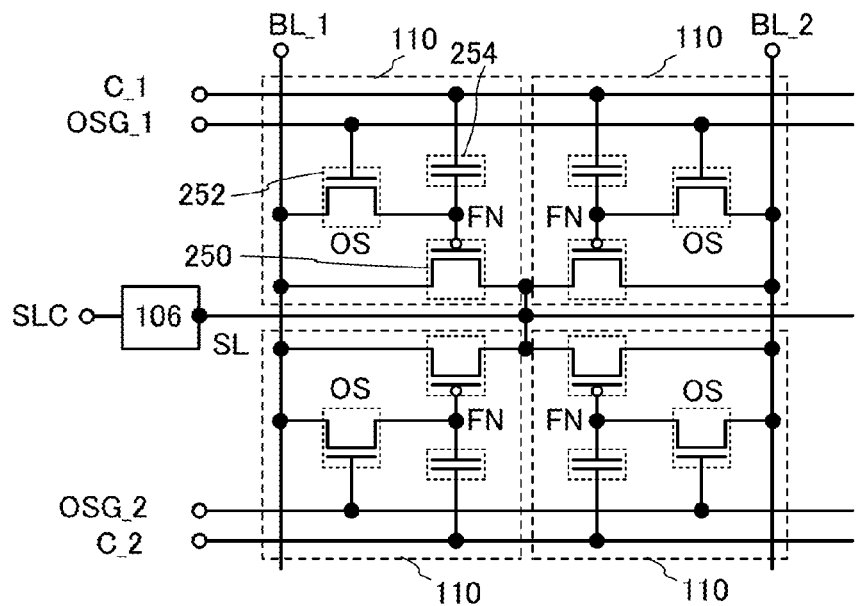

FIGS. 3A and 3B are each a circuit diagram in which memory cells illustrated in FIG. 2A are arranged in a matrix of two rows and two columns. The configurations of the memory cells 110 in FIGS. 3A and 3B are similar to that in FIG. 2A1. Note that in FIG. 3A, one source line SL is shared by the memory cells in two columns. In FIG. 3B, one source line SL is shared by the memory cells in two rows. Sharing of one source line SL by the memory cells arranged in a plurality of rows or columns leads to a reduction in number of wirings.

Note that without limitation to two columns (or two rows), memory cells in three or more columns (or three or more rows) may share one source line SL, although not illustrated.

In FIGS. 3A and 3B, the source line SL is electrically connected to a source line switching circuit 106. The source line switching circuit 106 is electrically connected to a source line switching signal line SLC.

In the circuits illustrated in FIGS. 3A and 3B, writing, storing, and reading of data can be performed in a manner similar to those of the case of FIGS. 2A1 and 2A2. Here, the case will be described where data "1" is stored when a power supply potential $V_{DD}$ is supplied to the node FN, whereas data "0" is stored when a ground potential GND is supplied to the node FN.

First, the potential of the write-read word line C_1 connected to the memory cells 110 is set to the ground potential GND and the potential of the write word line OSG_1 connected to the memory cells 110 is set to $V_{DD}$, so that the memory cells 110 of a row is selected. Accordingly, electric charge is applied to the node FN of the selected memory cell 110 from the bit line BL_1 (or bit line BL_2).

Here, in the case where the ground potential GND is supplied to the node FN, a potential at which the first transistor 250 is turned on is supplied to the gate of the first transistor 250. In that case, the potential of the source line SL is set to the ground potential GND in order to prevent an increase in potential supplied to the node FN due to current flowing between the bit line BL_1 and the source line SL (or between the bit line BL_2 and the source line SL).

Here, the signal path in the source line switching circuit 106 is switched with a signal of the source line switching signal line SLC to supply the ground potential GND to the source line SL. In the case where the potential of the source line SL is set to the ground potential GND, even when the first transistor 250 is turned on, the current can be prevented from flowing between the bit line BL_1 and the source line SL (or between the bit line BL_2 and the source line SL).

In the case where the plurality of memory cells 110 is arranged in a matrix as in FIGS. 3A and 3B, it is necessary to read out data only from the desired memory cell 110 in a reading period. In order to read out data only from the desired memory cell 110 and not to read out data from the other memory cells 110, the memory cells 110 from which data is not read out need to be in a non-selected state.

For example, in the case where either the power supply potential $V_{DD}$ or the ground potential GND is supplied to the node FN, data stored at the time when the power supply potential $V_{DD}$ is supplied to the node FN is data "1", and data stored at the time when the ground potential GND is supplied to the node FN is data "0", by supplying the ground potential GND to the source line SL, the power supply potential $V_{DD}$ to the write-read word line C_1, and the ground potential GND to the write word line OSG_1, the memory cells 110 of the row can be brought into a non-selected state.

When the power supply potential $V_{DD}$ is supplied to the write-read word line C_1, the potential of the node FN is raised by the power supply potential $V_{DD}$ due to capacitive coupling with the capacitor 254. In the case where the power supply potential $V_{DD}$ corresponding to data "1" is supplied to the node FN, the potential of the node FN is raised by the power supply potential $V_{DD}$ to $2V_{DD}$ ($V_{DD}+V_{DD}=2V_{DD}$) and the gate voltage of the first transistor 250 (the difference between the potentials of the source and the gate) becomes higher than the threshold voltage; accordingly, the first transistor 250, which is a p-channel transistor, is turned off. In the case where the ground potential GND corresponding to data "0" is supplied to the node FN, the potential of the node FN is raised by the power supply potential $V_{DD}$ to $V_{DD}$ (GND+$V_{DD}=V_{DD}$) and the gate voltage of the first transistor 250 (the difference between the potentials of the source and the gate) becomes higher than the threshold voltage; accordingly, the first transistor 250, which is a p-channel transistor, is turned off. Briefly, by supplying the power supply potential $V_{DD}$ to the write-read word line C, the first transistor 250 can be turned off, that is, the memory cell 110 can be brought into a non-selected state regardless of the potential of the node FN (stored data).

Note that if n-channel transistors are used as the first transistors 250 serving as reading transistors, in the case where the gate voltage (the difference in potential between the source and the gate) of the n-channel transistors is higher than the threshold voltage of the transistors, not all the memory cells can be turned off even by applying 0 V to the write-read word line. Thus, in order to bring the memory cells in a row into a non-selected state, a negative potential needs to be supplied to the write-read word line in the corresponding non-selected row. In contrast, in the storage device described in this embodiment, p-channel transistors are used as the first transistors 250 serving as reading transistors; thus, the memory cells in a non-selected row can be turned off regardless of the potential of the node FN (stored data) by supplying a high potential to the write-read word line in the non-selected row. Accordingly, a power source generating a negative potential does not need to be provided for the memory cells. As a result, power consumption can be reduced and the storage device can be downsized.

As described above, in the storage devices having the circuit configurations illustrated in FIGS. 3A and 3B, the area of the storage portion (memory cell array) can be reduced by sharing of the source line SL by the memory cells in a plurality of columns (or a plurality of rows). Accordingly, the die size can be reduced, leading to a reduction in manufacturing cost of the storage device. Moreover, yield can be improved.

The first switch 102a and the second switch 102b are electrically connected to the first storage portion 101a and the second storage portion 101b, respectively. The first switch 102a and the second switch 102b control whether an input/output signal (a signal from an input-output line sub_io or an inverted input-output line sub_iob) input from the second driver circuit 104 is input to the bit line BL and the inverted bit line BLB which are provided in the first storage portion 101a, the second storage portion 101b, and the first driver circuit 103. The number of transistors included in the first switch 102a is equal to that of the bit lines BL therein. The number of transistors included in the second switch 102b is equal to that of the inverted bit lines BLB therein.

Figure 4A:
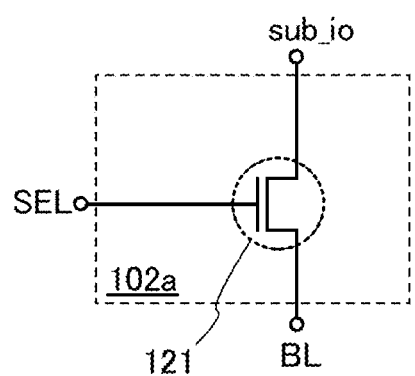
FIGS. 4A and 4B each illustrate a switch of a storage device of one embodiment of the present invention.

FIG. 4A illustrates one of switches included in the first switch 102a. One of a source and a drain of a transistor 121 is electrically connected to the input-output line sub_io from which an input/output signal is input, and the other of the source and the drain of the transistor 121 is electrically connected to the bit line BL. A gate of the transistor 121 is electrically connected to a wiring SEL.

Figure 4B:
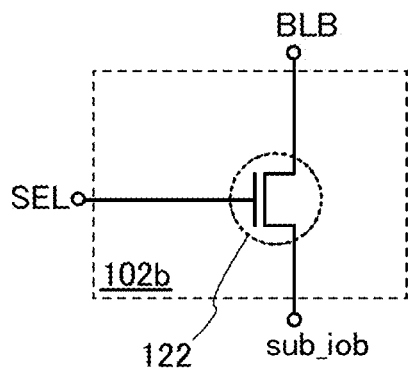

FIG. 4B illustrates one of switches included in the second switch 102b. One of a source and a drain of a transistor 122 is electrically connected to the inverted input-output line sub__iob from which an input/output signal is input, and the other of the source and the drain of the transistor 122 is electrically connected to the inverted bit line BLB. A gate of the transistor 122 is electrically connected to the wiring SEL.

The wiring SEL is electrically connected to the third driver circuit 105. The third driver circuit 105 controls on/off of the transistors 121 and 122.

Next, the configurations and operations of the first driver circuit 103 and the second driver circuit 104 of the storage device of one embodiment of the present invention will be described.

Figure 5:
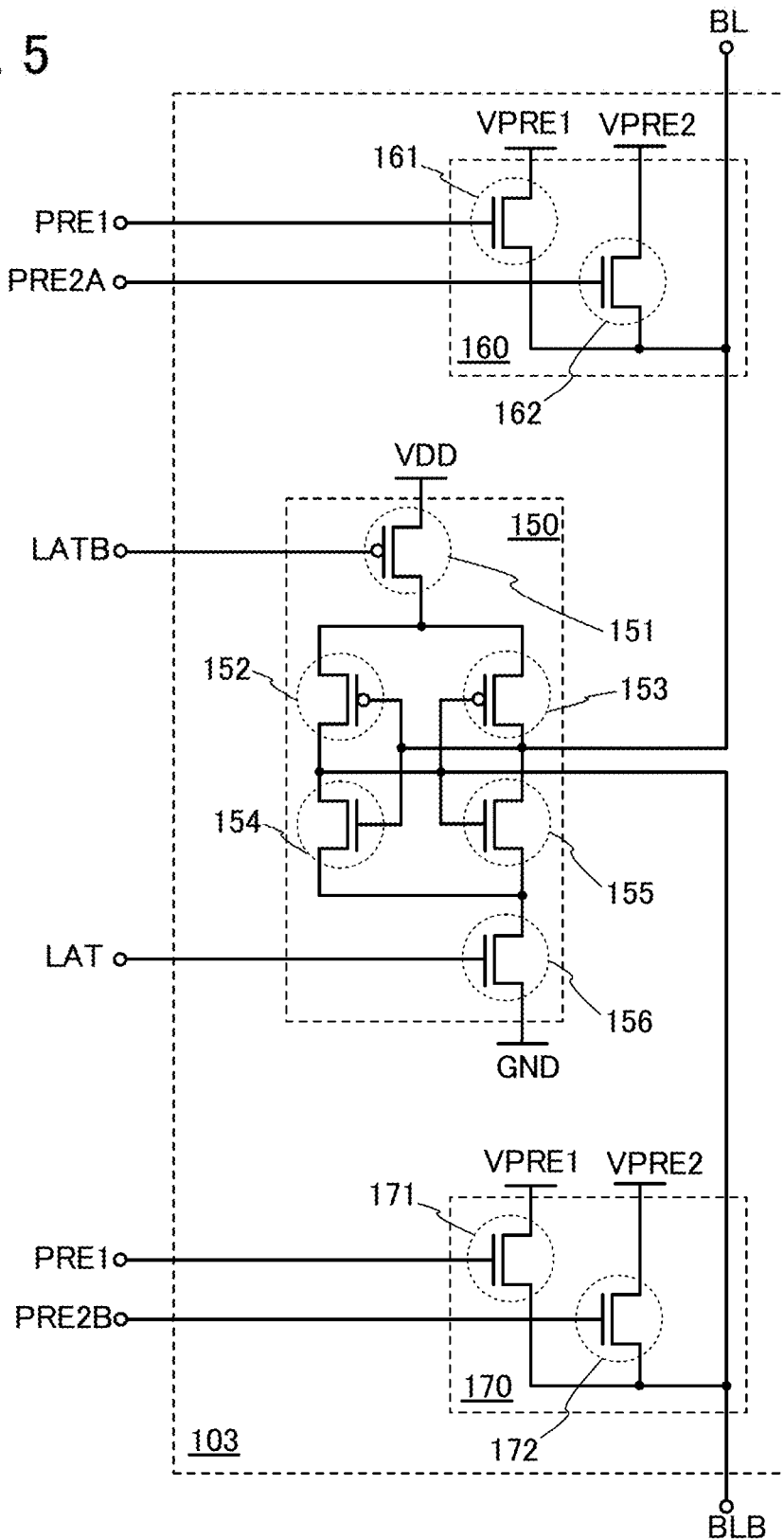
FIG. 5 illustrates a driver circuit of a storage device of one embodiment of the present invention.

The first driver circuit 103 includes a sense amplifier 150, a first precharge switch 160, and a second precharge switch 170 (FIG. 5). The configuration of the second driver circuit 104 is not particularly limited; a circuit having the same configuration as the first driver circuit 103 or a circuit having another configuration may be used.

The sense amplifier 150 includes a transistor 151, a transistor 152, a transistor 153, a transistor 154, a transistor 155, and a transistor 156. The power supply potential $V_{DD}$ is supplied to one of a source and a drain of the transistor 151, and the other of the source and the drain of the transistor 151 is electrically connected to one of a source and a drain of the transistor 152 and one of a source and a drain of the transistor 153. The other of the source and the drain of the transistor 152 is electrically connected to one of a source and a drain of the transistor 154, gates of the transistor 153 and the transistor 155, and the inverted bit line BLB. The other of the source and the drain of the transistor 153 is electrically connected to one of a source and a drain of the transistor 155, gates of the transistor 152 and the transistor 154, and the bit line BL. The other of the source and the drain of the transistor 154 and the other of the source and the drain of the transistor 155 are electrically connected to one of a source and a drain of the transistor 156. The ground potential GND is supplied to the other of the source and the drain of the transistor 156. A latch signal line LAT is connected to a gate of the transistor 156, and an inverted latch signal line LATB is connected to a gate of the transistor 151.

The first precharge switch 160 includes a transistor 161 and a transistor 162. A first precharge potential $V_{PRE1}$ is supplied to one of a source and a drain of the transistor 161, and a second precharge potential $V_{PRE2}$ is supplied to one of a source and a drain of the transistor 162. The other of the source and the drain of the transistor 161 is electrically connected to the other of the source and the drain of the transistor 162 and the bit line BL. Note that a signal is input to a gate of the transistor 161 from a first precharge switch signal line PRE1, and a signal is input to a gate of the transistor 162 from a second precharge switch signal line PRE2A.

The second precharge switch 170 includes a transistor 171 and a transistor 172. The first precharge potential $V_{PRE1}$ is supplied to one of a source and a drain of the transistor 171, and the second precharge potential $V_{PRE2}$ is supplied to one of a source and a drain of the transistor 172. The other of the source and the drain of the transistor 171 is electrically connected to the other of the source and the drain of the transistor 172 and the inverted bit line BLB. A gate of the transistor 171 is electrically connected to the first precharge switch signal line PRE1, and a gate of the transistor 172 is electrically connected to a second precharge switch signal line PRE2B.

The first switch 102a and the second switch 102b are electrically connected to the second driver circuit 104 having the input-output line, and the second driver circuit 104 inputs signals from the input-output line sub_io and the inverted input-output line sub_iob to the first storage portion 101a and the second storage portion 101b.

The third driver circuit 105 is electrically connected to the first storage portion 101a, the second storage portion 101b, the first switch 102a, the second switch 102b, and the first driver circuit 103, and inputs a variety of signals to these circuits.

Figure 6:
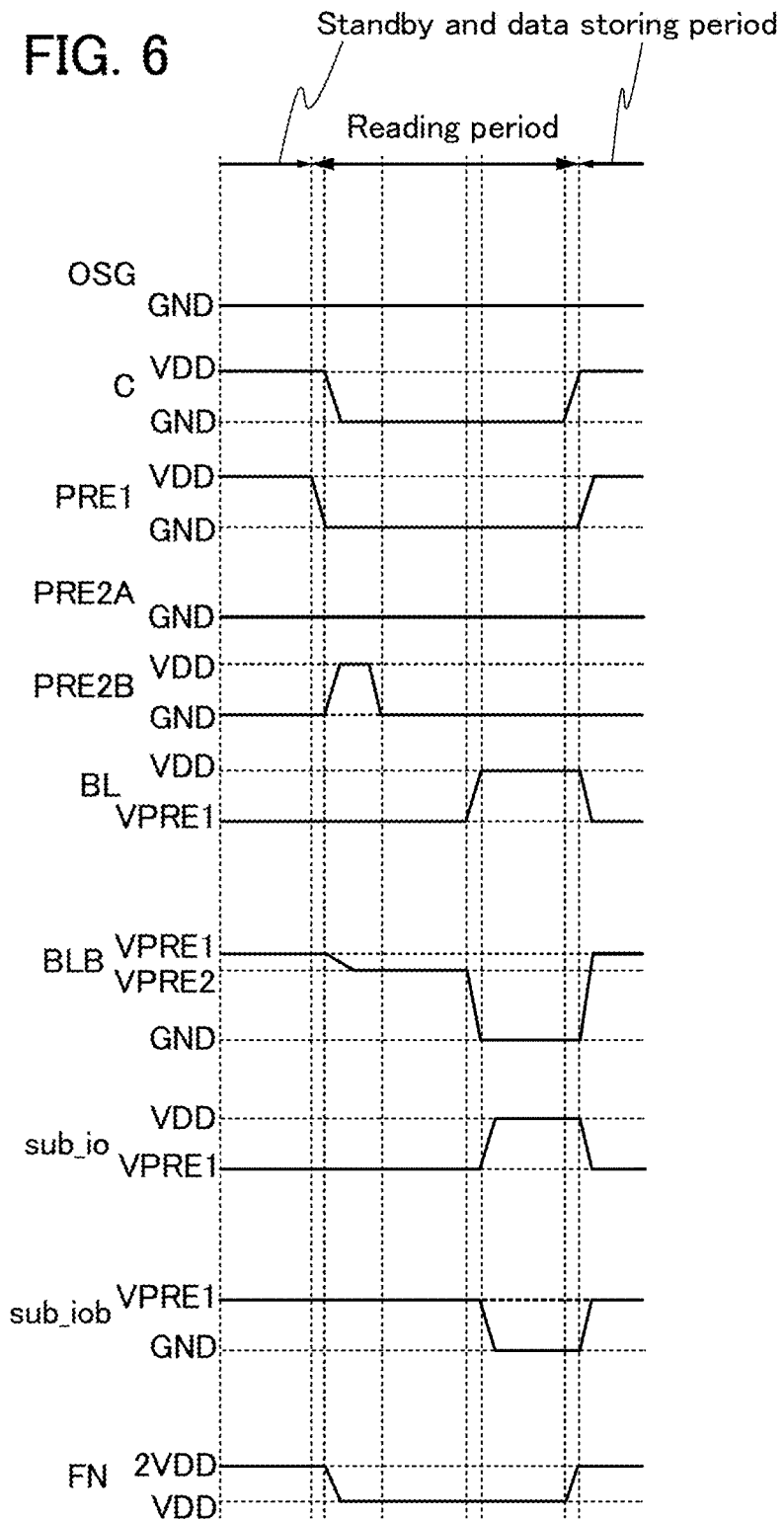
FIG. 6 shows the operation of a storage device of one embodiment of the present invention.
Figure 7:
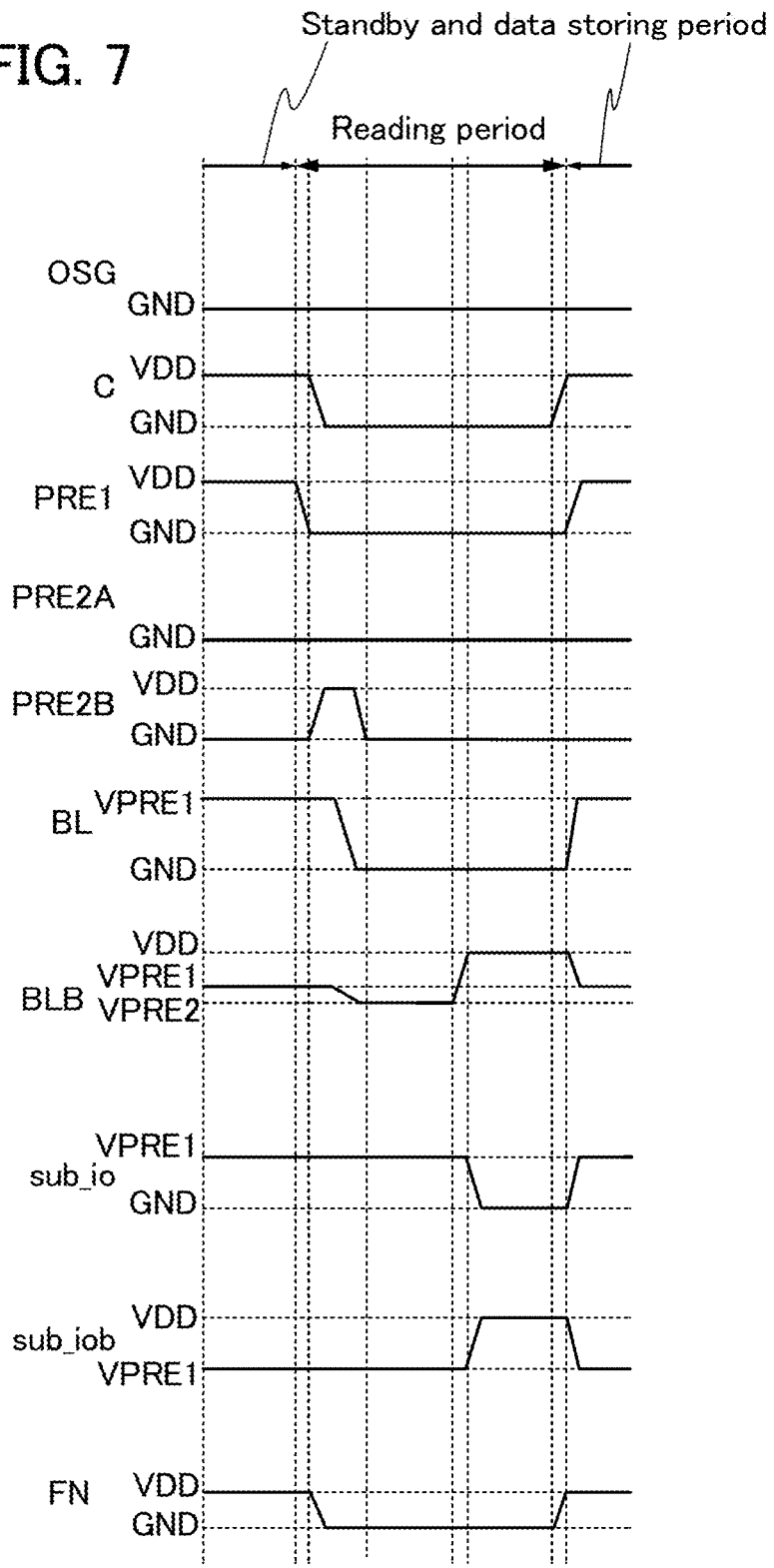
FIG. 7 shows the operation of a storage device of one embodiment of the present invention.

Next, the operation of the storage device of one embodiment of the present invention will be described with reference to FIGS. 6 to 11. FIG. 6 is a timing chart of signals supplied to the storage device in reading out the data "1" stored at the node FN. FIG. 7 is a timing chart of the signals supplied to the storage device in reading out the data "0" stored at the node FN. FIG. 8 is a timing chart of the signals supplied to the storage device in writing the data "1" to the node FN. FIG. 9 is a timing chart of the signals supplied to the storage device in writing the data "0" to the node FN. Note that FIGS. 8 and 9 are each a timing chart of the signals supplied to the storage device in the case where the potential of the input-output line, the potential of the bit line BL, and the potential of the inverted bit line BLB are different from one another. FIG. 10 is a timing chart of the signals supplied to the storage device in the case where the potential of the input-output line and the potential of the bit line BL are equal to each other at the node FN and the data "0" is written. FIG. 11 is a timing chart of the signals supplied to the storage device in the case where the potential of the input-output line and the potential of the bit line BL are equal to each other at the node FN and the data "1" is written.

In FIGS. 6 to 11, the potential of a signal at which the transistor is turned on and which is input to the write-read word line C and the write word line OSG is the power supply potential $V_{DD}$, and the potential of a signal at which the transistor is turned off is the ground potential GND; however, the potentials of the signals input to the write-read word line C and the write word line OSG are not limited to the power supply potential $V_{DD}$ and the ground potential GND and can be set to any potentials as long as the transistor can be turned on or off.

Note that in FIGS. 6 to 11, the potential of the input-output line sub_io and the potential of the inverted input-output line sub_iob in a standby period are equal to the potential of the bit line BL in the standby period. However, one embodiment of the present invention is not limited thereto; the potential of the input-output line sub_io and the potential of the inverted input-output line sub_iob in the standby period may be set to a potential different from the potential of the bit line BL in the standby period.

Here, the operation of reading out data from the memory cell in the first storage portion 101a will be described. First, a signal is input (for example, the power supply potential $V_{DD}$ is supplied) from the first precharge switch signal line PRE1 to turn on the transistor 161 included in the first precharge switch 160, whereby the bit line BL is precharged to the first precharge potential $V_{PRE1}$ (first potential). The first precharge potential $V_{PRE1}$ is set higher than the second precharge potential $V_{PRE2}$ (fifth potential) which is to be supplied to the inverted bit line BLB. Note that when the transistor 161 is turned on, the transistor 171 is also turned on; thus, the potential of the inverted bit line BLB at this time is the first precharge potential $V_{PRE1}$.

In reading out data, first, the input of a signal from the first precharge switch signal line PRE1 is stopped (for example, the ground potential GND is supplied) to turn off the transistor 161 and the transistor 171. Then, the potential of the desired write-read word line C (fourth potential) is controlled to select the desired memory cell. Here, the potential of the desired write-read word line C is changed from the power supply potential $V_{DD}$ to the ground potential GND. In the above manner, the process proceeds from the standby period to a reading period.

Here, the potential of the source line SL (second potential) is the ground potential GND.

When the data stored at the node FN of the selected memory cell is "0" (FIG. 7), that is, when the potential of the node FN after the ground potential GND is supplied to the desired write-read word line C (third potential) is the ground potential GND (a potential at which the first transistor 250 is not turned off), the first transistor 250, which is a p-channel transistor, is turned on. When the first transistor 250 is turned on, current flows from the bit line BL to the source line SL; thus, the potential of the bit line BL is lowered. Here, the potential of the bit line BL is lowered from the first precharge potential $V_{PRE1}$ to the ground potential GND.

When the data stored at the node FN of the selected memory cell is "1" (FIG. 6), that is, when the power supply potential $V_{DD}$ (a potential at which the first transistor 250 is turned off) is supplied to the node FN after the ground potential GND is supplied to the desired write-read word line C, the first transistor 250 is not turned on. Thus, current does not flow from the bit line BL to the source line SL, so that the potential of the bit line BL is kept at the first precharge potential $V_{PRE1}$.

In short, when the data stored at the node FN of the selected memory cell is "0", the potential of the bit line BL is the ground potential GND, and when the data stored at the node FN of the selected memory cell is "1", the potential of the bit line BL is the first precharge potential $V_{PRE1}$.

Here, a signal is input (for example, the power supply potential $V_{DD}$ is supplied) from the second precharge switch signal line PRE2B to turn on the transistor 172 included in the second precharge switch 170, whereby the second precharge potential $V_{PRE2}$ is supplied to the inverted bit line BLB.

Then, a signal is input (for example, the power supply potential $V_{DD}$ is supplied) from the latch signal line LAT and the input of a signal from the inverted latch signal line LATB is stopped (for example, the ground potential GND is supplied), whereby the transistor 151 and the transistor 156 are turned on, which makes the potential of the bit line BL become the power supply potential $V_{DD}$ or the ground potential GND in accordance with the relation between the level of the potential of the bit line BL and that of the inverted bit line BLB. Since the potential of the inverted bit line BLB is the second precharge potential $V_{PRE2}$, in the case where the potential of the bit line BL is the first precharge potential $V_{PRE1}$, the potential of the bit line BL is higher than the potential of the inverted bit line BLB. In this case, the potential of the bit line BL is raised to the power supply potential $V_{DD}$ (sixth potential). On the other hand, in the case where the potential of the bit line BL is the ground potential GND, the potential of the bit line BL is lower than the potential of the inverted bit line BLB and therefore is lowered to the ground potential GND.

In reading out data from the memory cell in the second storage portion 101b, a signal is input (for example, the power supply potential $V_{DD}$ is supplied) from the second precharge switch signal line PRE2A to turn on the transistor 162 included in the first precharge switch 160, whereby the second precharge potential $V_{PRE2}$ is supplied to the bit line BL.

Here, when a signal from the wiring SEL is input to the gate of the transistor 122 electrically connected to the bit line BLB to turn on the transistor 122, the potential of the bit line BLB is supplied to the input-output line, so that data can be read out.

The operation of reading out data from the memory cell in the second storage portion 101b can be performed in the same way as the operation of reading out data from the memory cell in the first storage portion 101a. That is to say, in the above operation, instead of inputting the signal from the second precharge switch signal line PRE2B to turn on the transistor 172, the signal from the second precharge switch signal line PRE2A is input to turn on the transistor 162 so that the potential of the inverted bit line BLB can be read out from the input-output line.

Specifically, a signal is input (for example, the power supply potential $V_{DD}$ is supplied) from the latch signal line LAT and the input of a signal from the inverted latch signal line LATB is stopped (for example, the ground potential GND is supplied), whereby the transistor 151 and the transistor 156 are turned on, which makes the potential of the inverted bit line BLB become the power supply potential $V_{DD}$ or the ground potential GND in accordance with the relation between the level of the potential of the bit line BL and that of the inverted bit line BLB. Since the second precharge potential $V_{PRE2}$ is supplied to the bit line BL, in the case where the first precharge potential $V_{PRE1}$ is supplied to the inverted bit line BLB, the potential of the inverted bit line BLB is higher than the potential of the bit line BL. In this case, the potential of the inverted bit line BLB is raised to the power supply potential $V_{DD}$. In the case where the potential of the inverted bit line BLB is lowered to the ground potential GND, the potential of the inverted bit line BLB becomes lower than the potential of the bit line BL and is lowered to the ground potential GND (seventh potential).

In the above manner, data can be read out. After reading out data, the potential of the write-read word line C is returned to the power supply potential $V_{DD}$, whereby a standby and data storing period starts.

Next, the operation in a data writing period will be described. Steps up to and including a step of inputting a signal from the latch signal line LAT and the inverted latch signal line LATB to turn on the transistor 151 and the transistor 156 are the same as those in a reading period.

A signal depending on data is input from the input-output line with the transistor 151 and the transistor 156 turned on. The potential of the signal input from the input-output line is set to the power supply potential $V_{DD}$ or the ground potential GND in accordance with data to be written. For example, in the case of writing the data "1", the potential of the signal is set to the power supply potential $V_{DD}$, and in the case of writing the data "0", the potential of the signal is set to the ground potential GND.

When the transistor 121 provided between the bit line BL and the input-output line is turned on, in the case where the potential of the bit line BL and the potential of the input-output line are different from each other, a collision between a signal from the bit line BL and a signal from the input-output line occurs. In view of the above, the capacitance of the bit line BL is set to smaller than that of the input-output line, whereby the potential of the input-output line can be made to be equal to that of the bit line BL.

Then, a signal is input to the write word line OSG to turn on the second transistor 252 in the desired memory cell so that the potential of the bit line BL of the desired memory cell is supplied to the node FN. After that, a signal is input to the write word line OSG to turn off the second transistor 252. Since the off-state current of the second transistor 252 is small, data can be stored in the memory storing portion. Subsequently, the potential of the write-read word line C is returned to the power supply potential $V_{DD}$, whereby a standby and data storing period starts.

In the first switch 102a, the transistor 121 is turned on by a signal from the wiring SEL in the selected column; thus, the bit line BL and the input-output line sub_io in the selected column are connected.

In the second switch 102b, the transistor 122 is off in a column other than the selected column (in a non-selected column); thus, the inverted bit line BLB and the inverted input-output line sub_iob in the selected column are not connected.

Note that the number of columns selected simultaneously may be plural. To select a plurality of columns simultaneously, a plurality of input-output lines sub_io or a plurality of inverted input-output lines sub_iob needs to be provided.

The use of the first to third driver circuits 103 to 105 operating in the above-described manner enables manufacture of the storage device which stores data in the memory storing portion without a page buffer by writing back data in the memory storing portion in the non-selected column.

Although the case where the first transistor 250 is a p-channel transistor is described in this embodiment, the first transistor 250 may be an n-channel transistor.

(Embodiment 2)

In this embodiment, the structure of a storage device of one embodiment of the present invention and a manufacturing method thereof will be described.

Figure 12A:
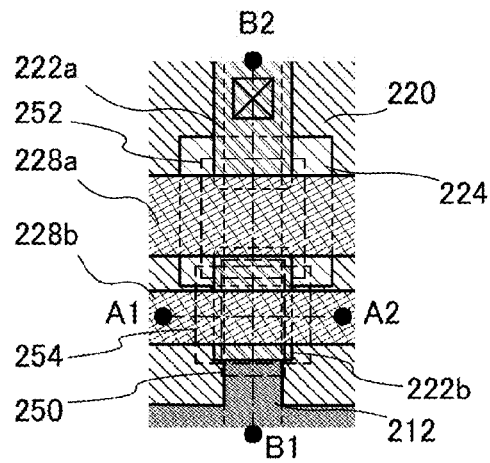
FIGS. 12A and 12B are a top plan view of a storage device of one embodiment of the present invention and a cross-sectional view thereof, respectively.
Figure 12B:
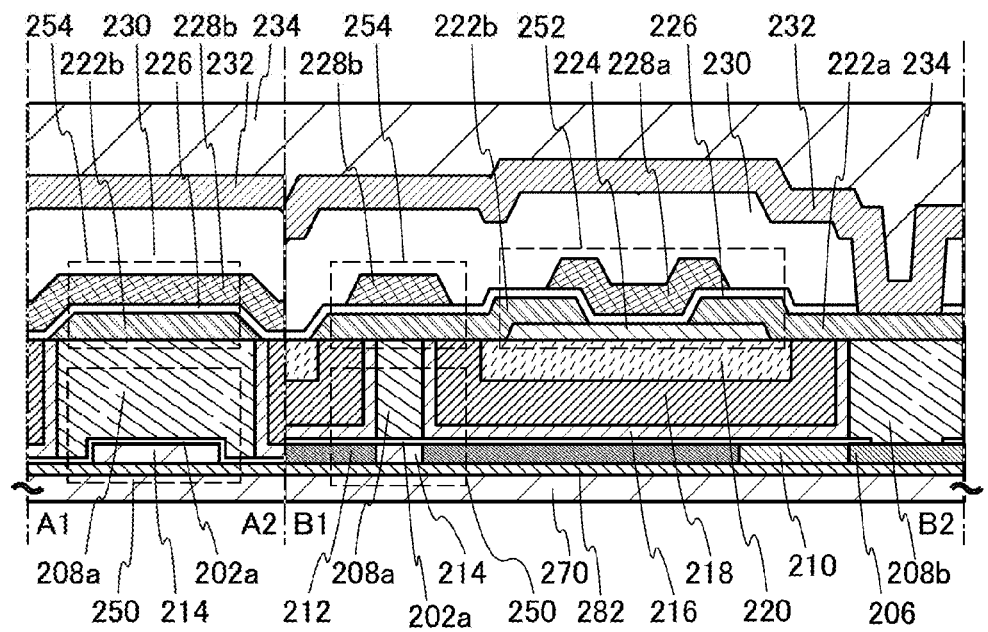

FIG. 12A is a top plan view of a storage device that is one embodiment of the present invention, and FIG. 12B is a cross-sectional view thereof along A1-A2 and B1-B2 in FIG. 12A.

The storage device illustrated in FIGS. 12A and 12B includes the first transistor 250 including a first semiconductor material in a lower portion, and a second transistor 252 including a second semiconductor material in an upper portion. In such a structure, different materials depending on respective electric characteristics needed for the first transistor 250 and the second transistor 252 can be used as the first semiconductor material and the second semiconductor material.

When different materials are used as the first semiconductor material and the second semiconductor material, for example, the first semiconductor material can be a semiconductor material other than an oxide semiconductor, and the second semiconductor material can be an oxide semiconductor. Examples of the semiconductor material other than an oxide semiconductor are silicon, germanium, silicon germanium, silicon carbide, gallium arsenide, and an organic semiconductor material.

The storage device in FIGS. 12A and 12B can be used for a memory cell. When the storage device in FIGS. 12A and 12B is used for a memory cell, it is preferable that the first transistor 250 be capable of operating at high speed and the amount of the leakage current between the source and the drain of the second transistor 252 (the current flowing between the source and the drain when the second transistor 252 is off) be small. For this reason, the first semiconductor material is preferably a single crystal semiconductor (such as single crystal silicon), and the second semiconductor material is preferably an oxide semiconductor. When the amount of the leakage current between the source and the drain of the second transistor 252 is small, electric charge can be stored at the node FN for a long time; thus, data can be stored in the memory cell for a long time.

The first transistor 250 in FIGS. 12A and 12B includes a channel formation region 214 which is provided in a semiconductor layer over a semiconductor substrate 270; third impurity regions 212 between which the channel formation region 214 is provided; a gate insulating layer 202a which is provided over the channel formation region 214; and a gate electrode 208a which is provided over the gate insulating layer 202a so as to overlap with the channel formation region 214. Here, the third impurity regions 212 serve as a source region and a drain region.

In this specification, the term "source" includes at least one of a source electrode and a source region and may refer to both a source electrode and a source region, and the term "drain" includes at least one of a drain electrode and a drain region and may refer to both a drain electrode and a drain region.

A first conductive layer 208b is connected to a first impurity region 206 in the semiconductor layer over the semiconductor substrate 270. The first conductive layer 208b serves as a source electrode or a drain electrode of the first transistor 250. A second impurity region 210 is provided between the first impurity region 206 and the third impurity region 212.

A first insulating layer 216, a second insulating layer 218, and a third insulating layer 220 are provided so as to cover part of the first transistor 250. The use of the structure where the first transistor 250 does not include a sidewall insulating layer as illustrated in FIGS. 12A and 12B enables high integration. Note that one embodiment of the present invention is not limited thereto; the first transistor 250 may include a sidewall insulating layer. When the first transistor 250 includes a sidewall insulating layer, a region with a different impurity element concentration, what is called a lightly doped drain (LDD) region, can be easily formed between the third impurity region 212 and the channel formation region 214.

The second transistor 252 in FIGS. 12A and 12B includes an oxide semiconductor layer 224 which is provided over the third insulating layer 220 and the like; a source electrode 222a and a drain electrode 222b which are electrically connected to the oxide semiconductor layer 224; a gate insulating layer 226 which is provided over the source electrode 222a, the drain electrode 222b, and the oxide semiconductor layer 224; and a gate electrode 228a which is provided over the gate insulating layer 226 so as to overlap with the oxide semiconductor layer 224. Note that the reference numerals 222a and 222b may denote a drain electrode and a source electrode, respectively.

Here, the oxide semiconductor layer 224 preferably has a low hydrogen concentration and a sufficiently high oxygen concentration. Specifically, the hydrogen concentration (SIMS measurement value) in the oxide semiconductor layer 224 is $5 \times 10^{19}$ atoms/cm$^3$ or less, preferably $5 \times 10^{18}$ atoms/cm$^3$ or less, more preferably $5 \times 10^{17}$ atoms/cm$^3$ or less. Such an oxide semiconductor from which hydrogen is sufficiently reduced and to which enough oxygen is supplied is called a "highly purified oxide semiconductor".

In the highly purified oxide semiconductor, defect levels in an energy gap due to oxygen vacancies are reduced because the hydrogen concentration is sufficiently reduced and enough oxygen is supplied. The carrier concentration in the highly purified oxide semiconductor layer 224 is lower than $1 \times 10^{12}$/cm$^3$, preferably lower than $1 \times 10^{11}$/cm$^3$, more preferably lower than $1.45 \times 10^{10}$/cm$^3$. These values are sufficiently smaller than the carrier density of a general silicon wafer (approximately $1 \times 10^{14}$/cm$^3$) and thus, the off-state current can be reduced. For example, the off-state current per unit channel width (1 μm) under the conditions where the channel length is 3 μm and the temperature is room temperature (25° C.) is 100 zA (zeptoampere) or less, preferably 10 zA or less. The use of such an oxide semiconductor for the second transistor 252 leads to a significant reduction in off-state current of the second transistor 252.

Note that the oxygen concentration is set so that the oxygen can be supplied sufficiently to reduce defect levels in an energy gap due to oxygen vacancies and thus the carrier concentration falls within the above range.

Although the oxide semiconductor layer 224 having an island shape by processing is used for the second transistor 252 in FIGS. 12A and 12B, one embodiment of the present invention is not limited thereto. The oxide semiconductor layer of the second transistor 252 does not necessarily have to have an island shape. When the oxide semiconductor layer has an island shape, the generation of leakage current between adjacent elements can be suppressed. When the oxide semiconductor layer does not have an island shape, a step of processing the oxide semiconductor layer (e.g., an etching step) is not performed; accordingly, the contamination of the oxide semiconductor layer due to the processing can be prevented.

The capacitor 254 in FIGS. 12A and 12B includes the drain electrode 222b, a second conductive layer 228b, and the gate insulating layer 226 sandwiched between the drain electrode 222b and the second conductive layer 228b. When the capacitor 254 has such a structure, the capacitor 254 can be formed through the same process as the second transistor 252, and further, enough capacitance can be obtained by adjustment of the plane layout. Note that in the case where the storage device of one embodiment of the present invention does not need capacitance, the capacitor 254 does not necessarily have to be provided.

In this embodiment, the second transistor 252 and the capacitor 254 at least partly overlap with the first transistor 250, which enables a reduction in area of the memory cell for high integration. For example, given that the minimum feature size is F, the area occupied by one memory cell can be 15 $F^2$ to 25 $F^2$.

A fourth insulating layer 230 is provided over the second transistor 252 and the capacitor 254. A wiring 232 is provided in an opening formed in the gate insulating layer 226 and the fourth insulating layer 230. The wiring 232 connects the plurality of memory cells with each other and corresponds to the bit line BL in the circuit diagram of FIGS. 2A1 and 2B. The wiring 232 is connected to the first impurity region 206 through the source electrode 222a and the first conductive layer 208b. Thus, the number of wirings can be smaller than that in the case where a source region and a drain region of the first transistor 250 are connected to the source electrode 222a of the second transistor 252 by different wirings.

Further, the wiring 232 overlaps with the first impurity region 206; thus, an increase in element area due to a contact region can be controlled, leading to higher integration of the storage device.

Note that FIGS. 12A and 12B illustrate a specific example of the structure of the storage device; however, one embodiment of the present invention is not limited to this example.

Next, a description will be given of an example of a method for manufacturing an SOI substrate used for the storage device in FIGS. 12A and 12B.

Figure 13A:
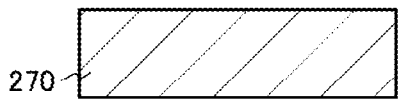
FIGS. 13A to 13G illustrate a manufacturing method of a storage device of one embodiment of the present invention.

First, the semiconductor substrate 270 is prepared as a base substrate (see FIG. 13A). As the semiconductor substrate 270, for example, a silicon substrate or a germanium substrate can be used. As the semiconductor substrate 270, a single crystal semiconductor substrate such as a single crystal silicon substrate or a single crystal germanium substrate is preferably used. Note that one embodiment of the present invention is not limited thereto. As the semiconductor substrate 270, a polycrystalline semiconductor substrates or a solar grade silicon (SOG-Si) substrate, or the like may be used. In the case of using a polycrystalline semiconductor substrate or a SOG-Si substrate, the manufacturing cost can be reduced as compared to the case of using a single crystal silicon substrate.

Note that, instead of the semiconductor substrate 270, a glass substrate, a quartz substrate, a ceramic substrate, or a sapphire substrate may be used. Examples of the glass substrate are aluminosilicate glass, aluminoborosilicate glass, and barium borosilicate glass. As the ceramic substrate, for example, one which contains silicon nitride and aluminum oxide as its main components and has a thermal expansion coefficient close to that of silicon may be used.

The semiconductor substrate 270 is preferably washed. Examples of a chemical solution which can be used for the washing are a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), a mixed solution of hydrofluoric acid, and hydrogen peroxide water, and pure water (FPM).

Figure 13B:
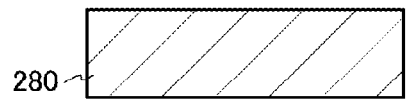

Then, a bond substrate is prepared. Here, a single crystal semiconductor substrate 280 is used as the bond substrate (see FIG. 13B). Note that the crystallinity of the bond substrate is not necessarily limited to single crystal.

As the single crystal semiconductor substrate 280, for example, a single crystal semiconductor substrate formed using a Group 14 element, such as a single crystal silicon substrate, a single crystal germanium substrate, or a single crystal silicon germanium substrate, can be used. Alternatively, a compound semiconductor substrate of gallium arsenide, indium phosphide, or the like may be used. Note that the single crystal semiconductor substrate 280 may be either a circular substrate or a substrate which has been processed to be rectangular.

Figure 13C:
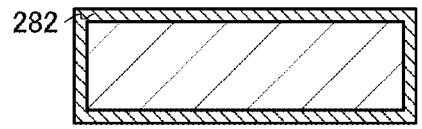

Then, an oxide layer 282 is formed over a surface of the single crystal semiconductor substrate 280 (see FIG. 13C). It is preferable that the surface of the single crystal semiconductor substrate 280 be washed with any of the above chemical solutions before the formation of the oxide layer 282. Here, a washing method in which diluted hydrogen fluoride and ozone water are discharged alternately is preferably employed because the usage of the chemical solution for the washing can be reduced.

The oxide layer 282 can be formed to have a single-layer or layered structure including any of a silicon oxide film, a silicon oxynitride film, and the like. The oxide layer 282 may be formed by, for example, a thermal oxidation method, a CVD method, or a sputtering method. When the oxide layer 282 is formed by a CVD method, a silicon oxide layer is preferably formed using organosilane such as tetraethoxysilane (abbreviation: TEOS) (chemical formula: $Si(OC_2H_5)_4$).

Here, a method in which thermal oxidation treatment is performed on the single crystal semiconductor substrate 280 to form the oxide layer 282 is employed.

When heating is performed in an oxidizing gas atmosphere containing a halogen as the thermal oxidation treatment, the oxide layer 282 can contain the halogen. For example, when the oxide layer 282 is made to contain chlorine, a heavy metal (such as Fe, Cr, Ni, or Mo) can be trapped and a chloride of the metal can be formed, which can be then easily removed, whereby contamination of the single crystal semiconductor substrate 280 can be prevented.

Note that the halogen contained in the oxide layer 282 may be fluorine. To make the oxide layer 282 contain fluorine, for example, the single crystal semiconductor substrate 280 may be soaked in hydrogen fluoride and then subjected to thermal oxidation treatment in an oxidizing gas atmosphere or in an oxidizing gas atmosphere containing $NF_3$.

Figure 13D:
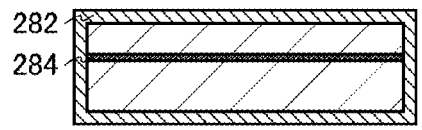

Next, ions are accelerated by an electric field and the single crystal semiconductor substrate 280 is exposed to the ions, whereby an embrittled region 284 where the crystal structure is damaged is formed in the single crystal semiconductor substrate 280 at a predetermined depth (see FIG. 13D).

The depth at which the embrittled region 284 is formed can be adjusted by the kinetic energy, the mass, electric charge, or the incident angle of the ions, or the like. The embrittled region 284 is formed at approximately the same depth as the average penetration depth of the ions. The thickness of a single crystal semiconductor layer to be separated from the single crystal semiconductor substrate 280 can be controlled by the depth at which the embrittled region 284 is formed. The thickness of this single crystal semiconductor layer is preferably greater than or equal to 10 nm and less than or equal to 500 nm, more preferably greater than or equal to 50 nm and less than or equal to 200 nm.

The ion exposure can be performed with an ion-doping apparatus or an ion implantation apparatus. Here, an example will be described in which the single crystal semiconductor substrate 280 is exposed to hydrogen ions using an ion-doping apparatus. A gas containing hydrogen is used as a source gas. As for ions used for the exposure, the proportion of $H_3^+$ is preferably set high. Specifically, it is preferable that the proportion of $H_3^+$ be set 50% or higher (more preferably, 80% or higher) with respect to the total amount of $H^+$, $H_2^+$, and $H_3^+$. With an increase in proportion of $H_3^+$, the efficiency of ion exposure can be improved.

Note that ions to be added are not limited to ions of hydrogen. Ions of helium or the like may be added. Further, ions to be added are not limited to one kind of ions, and plural kinds of ions may be added. For example, in the case of performing exposure to hydrogen and helium simultaneously using an ion-doping apparatus, the number of steps can be reduced, and further, surface roughness of the single crystal semiconductor layer can be reduced, as compared with the case of performing exposure to hydrogen and helium in different steps.

Note that a heavy metal of the wall of a chamber may also be added when the embrittled region 284 is formed using an ion-doping apparatus. In view of the above, the oxide layer 282 containing the halogen is formed and the ion exposure is performed through the oxide layer 282, whereby contamination of the single crystal semiconductor substrate 280 can be prevented.

Figure 13E:
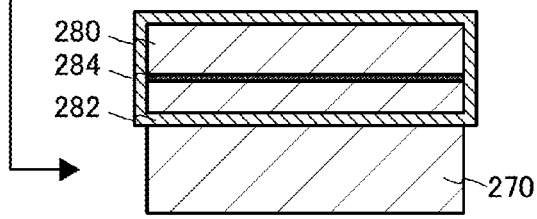

Then, the semiconductor substrate 270 and the single crystal semiconductor substrate 280 are disposed to face each other and firmly attached and bonded to each other with the oxide layer 282 provided therebetween (see FIG. 13E). Note that an oxide layer or a nitride layer may be formed over a surface of the semiconductor substrate 270.

When bonding is performed, it is preferable to apply a pressure of 0.001 N/cm$^2$ or more and 100 N/cm$^2$ or less, more preferably a pressure of 1 N/cm$^2$ or more and 20 N/cm$^2$ or less to one part of the semiconductor substrate 270 or one part of the single crystal semiconductor substrate 280. When the bonding surfaces are made close to each other and firmly attached to each other by applying pressure, bonding between the semiconductor substrate 270 and the oxide layer 282 is generated at the part where they are firmly attached, and the bonding spontaneously spreads to substantially the entire area. This bonding is performed under the action of the Van der Waals force or hydrogen bonding and can be performed at room temperature (approximately 5° C. to 35° C.) without heating.

Note that before the single crystal semiconductor substrate 280 and the semiconductor substrate 270 are bonded to each other, surfaces to be bonded to each other may be subjected to surface treatment by wet treatment, dry treatment, or a combination of wet treatment and dry treatment.

Note that heat treatment may be performed after the single crystal semiconductor substrate 280 and the semiconductor substrate 270 are bonded to each other. This heat treatment is performed at a temperature at which separation along the embrittled region 284 does not occur (for example, a temperature higher than or equal to room temperature (approximately 5° C. to 35° C.) and lower than 400° C.). Alternatively, the semiconductor substrate 270 and the oxide layer 282 may be bonded to each other while heating them at a temperature in this range. There is no particular limitation on an apparatus used for the heat treatment.

Figure 13F:
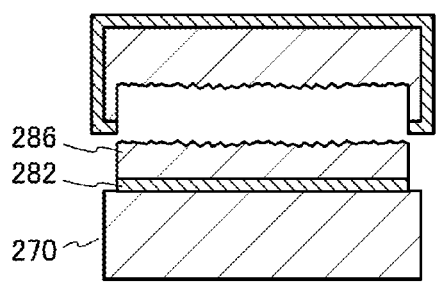

Next, heat treatment is performed so that separation of the single crystal semiconductor substrate 280 is caused along the embrittlement region 284 (see FIG. 13E), whereby a single crystal semiconductor layer 286 is formed over the semiconductor substrate 270 with the oxide layer 282 provided therebetween (FIG. 13F). Note that, here, the temperature for the heat treatment is, for example, higher than or equal to 300° C. and lower than or equal to 600° C., preferably higher than or equal to 400° C. and lower than or equal to 500° C. because surface roughness can be prevented.

Note that in the case of performing heat treatment at a temperature of 500° C. or higher after the separation of the single crystal semiconductor substrate 280, the concentration of hydrogen remaining in the single crystal semiconductor layer 286 can be reduced.

Figure 13G:
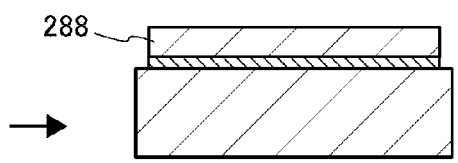

Next, a surface of the single crystal semiconductor layer 286 is irradiated with laser light, whereby a single crystal semiconductor layer 288 whose surface evenness is improved and whose defects are reduced is formed (see FIG. 13G). Note that instead of the laser light irradiation treatment, heat treatment may be performed. The laser light irradiation treatment may be performed after etching treatment for removing a region including many defects at the surface of the single crystal semiconductor layer 286 is performed. Alternatively, after the laser light irradiation, processing (e.g., etching treatment) may be performed so that the thickness of the single crystal semiconductor layer 286 is reduced.

As described above, an SOI substrate used for the storage device in FIGS. 12A and 12B can be obtained (see FIG. 13G).

Next, a method for manufacturing the storage device in FIGS. 12A and 12B will be described. First, a manufacturing method of the first transistor 250 will be described. Note that FIGS. 14A to 14E and FIGS. 15A to 15D are cross-sectional views illustrating part of the SOI substrate in FIG. 12B.

Figure 14A:
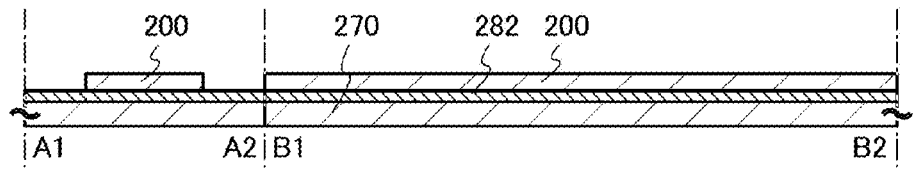
FIGS. 14A to 14E illustrate a manufacturing method of a storage device of one embodiment of the present invention.

First, the single crystal semiconductor layer 288 is processed to have an island shape, so that a semiconductor layer 200 is formed (see FIG. 14A). Note that before or after this step, an impurity element imparting a conductivity type may be added to the semiconductor layer 200 in order to control the threshold voltage of the transistor. In the case where silicon is used as the semiconductor layer 200, phosphorus, arsenic, or the like can be used as an impurity element imparting n-type conductivity. On the other hand, boron, aluminum, gallium, or the like can be used as an impurity element imparting p-type conductivity.

Figure 14B:
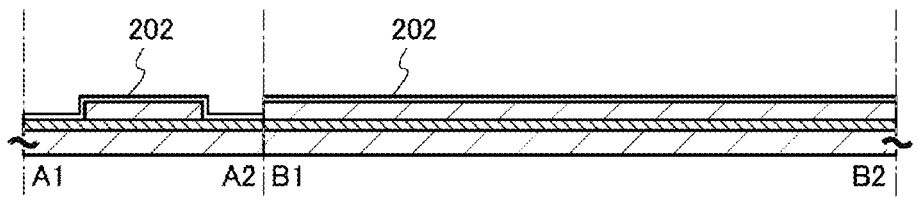

Next, a first insulating layer 202 is formed so as to cover the semiconductor layer 200 (see FIG. 14B). The first insulating layer 202 is to be a gate insulating layer later. The first insulating layer 202 can be formed, for example, by performing heat treatment (thermal oxidation treatment, thermal nitridation treatment, or the like) on a surface of the semiconductor layer 200. Instead of heat treatment, high-density plasma treatment may be performed. The high-density plasma treatment can be performed using, for example, a mixed gas of a rare gas such as He, Ar, Kr, or Xe and any of oxygen, nitrogen oxide, ammonia, nitrogen, and hydrogen. Alternatively, the insulating layer can be formed by a CVD method, a sputtering method, or the like. The first insulating layer 202 preferably has a single-layer or layered structure including any of silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) which contains nitrogen, hafnium aluminate (HfAl$_x$O$_y$ (x>0, y>0)) which contains nitrogen, and the like. The thickness of the first insulating layer 202 may be, for example, greater than or equal to 1 nm and less than or equal to 100 nm, preferably greater than or equal to 10 nm and less than or equal to 50 nm. Here, a single-layer insulating layer containing silicon oxide is formed by a plasma CVD method.

Figure 14C:
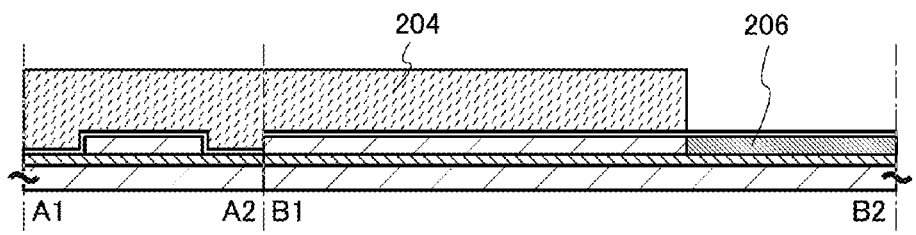

Next, a mask 204 is formed over the first insulating layer 202 and an impurity element imparting a conductivity type is added to the semiconductor layer 200, so that the first impurity region 206 is formed (see FIG. 14C). After that, the mask 204 is removed.

Figure 14D:
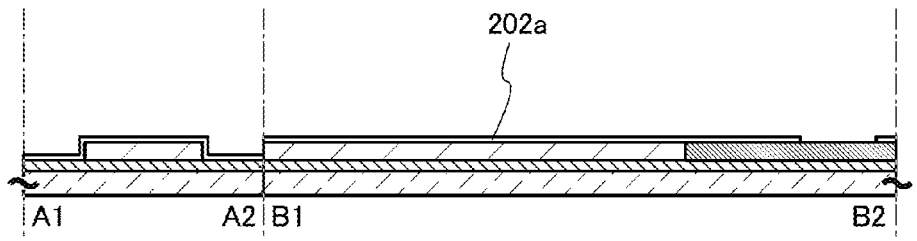

Next, a mask is formed over the first insulating layer 202 and a portion of the first insulating layer 202 which overlaps with the first impurity region 206 is partly removed, so that the gate insulating layer 202a is formed (see FIG. 14D). The portion of the first insulating layer 202 can be removed by etching.

Figure 14E:
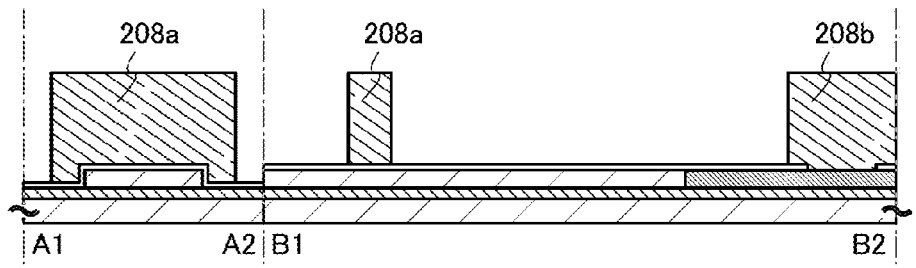

Next, a conductive layer is formed over the gate insulating layer 202a and is processed using a mask, so that the gate electrode 208a and the first conductive layer 208b are formed (see FIG. 14E). Here, there is no particular limitation on a material and a formation method of the conductive layer. Examples of a material of the conductive layer are metal materials such as aluminum, copper, titanium, tantalum, and tungsten, and polycrystalline silicon to which an impurity element imparting a conductivity type is added. Examples of a formation method of the conductive layer are an evaporation method, a CVD method, a sputtering method, and a spin coating method. Note that the conductive layer may be a single layer or a stack of a plurality of layers.

Figure 15A:
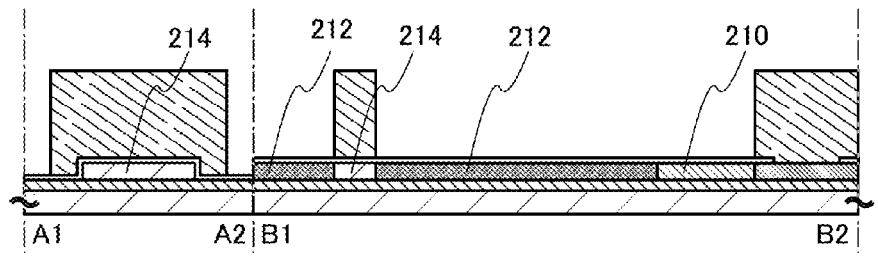
FIGS. 15A to 15D illustrate a manufacturing method of a storage device of one embodiment of the present invention.

Next, an impurity element imparting one conductivity type is added to the semiconductor layer with the use of the gate electrode 208a and the first conductive layer 208b as masks, so that the channel formation region 214, the second impurity region 210, and the third impurity region 212 are formed (see FIG. 15A). Here, an impurity element such as boron or aluminum may be added in order to form a p-channel transistor. After the impurity element is added to the semiconductor layer, heat treatment for activation is performed. The descending order of concentration of the added impurity element among the impurity regions is as follows: the second impurity region 210, the third impurity region 212, and the first impurity region 206.

Figure 15B:
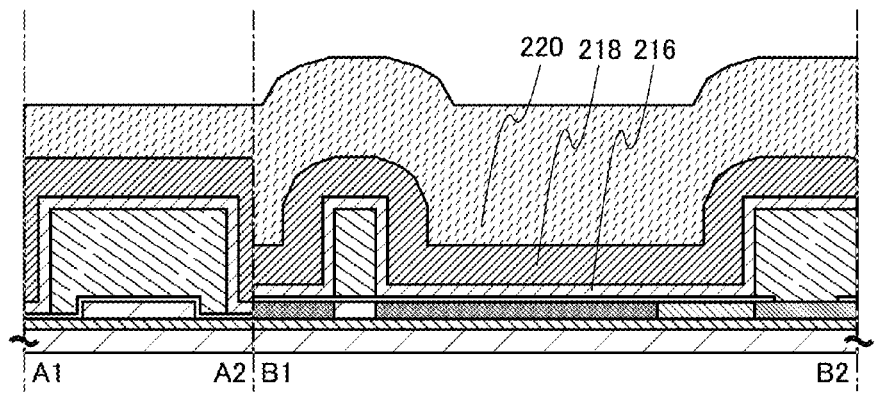

Next, the first insulating layer 216, the second insulating layer 218, and the third insulating layer 220 are formed so as to cover the gate insulating layer 202a, the gate electrode 208a, and the first conductive layer 208b (see FIG. 15B).

The first insulating layer 216, the second insulating layer 218, and the third insulating layer 220 can be formed using an inorganic insulating material such as silicon oxide, silicon oxynitride, silicon nitride oxide, silicon nitride, or aluminum oxide. Alternatively, the first insulating layer 216, the second insulating layer 218, and the third insulating layer 220 can be formed using an organic insulating material such as polyimide or acrylic. Note that the first insulating layer 216, the second insulating layer 218, and the third insulating layer 220 are preferably formed using a low dielectric constant (low-k) material because parasitic capacitance between a plurality of electrodes or wirings can be sufficiently reduced. Note that the first insulating layer 216, the second insulating layer 218, and the third insulating layer 220 may be porous insulating layers formed using any of the above materials. Since the porous insulating layer has a low dielectric constant, parasitic capacitance between a plurality of electrodes or wirings can be further reduced. Here, the case of using silicon oxynitride, silicon nitride oxide, and silicon oxide to form the first insulating layer 216, the second insulating layer 218, and the third insulating layer 220, respectively, will be described. Note that the first insulating layer 216, the second insulating layer 218, and the third insulating layer 220 may each have either a single-layer structure or a layered structure including a plurality of layers. Alternatively, a single insulating layer may be formed as the first insulating layer 216, the second insulating layer 218, and the third insulating layer 220.

Figure 15C:
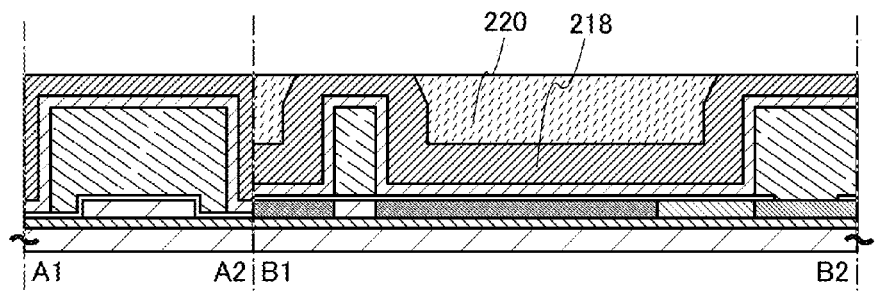

Next, the second insulating layer 218 and the third insulating layer 220 are subjected to CMP treatment or etching treatment (see FIG. 15C). Here, CMP treatment is performed until the second insulating layer 218 is partly exposed. When silicon nitride oxide is used for the second insulating layer 218 and silicon oxide is used for the third insulating layer 220, the second insulating layer 218 functions as an etching stopper.

Figure 15D:
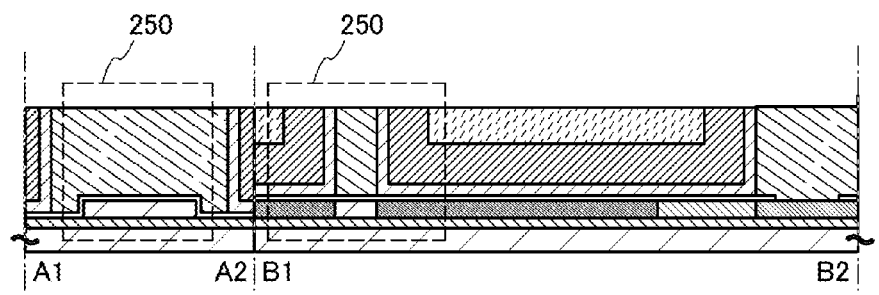

Next, the first insulating layer 216, the second insulating layer 218, and the third insulating layer 220 are subjected to CMP treatment or etching treatment, so that the upper surfaces of the gate electrode 208a and the first conductive layer 208b are exposed (see FIG. 15D). Here, etching is performed until the gate electrode 208a and the first conductive layer 208b are partly exposed. For the etching treatment, dry etching is preferably performed, but wet etching may be performed. In exposing the upper surfaces of the gate electrode 208a and the first conductive layer 208b, surfaces of the first insulating layer 216, the second insulating layer 218, and the third insulating layer 220 are preferably planarized as much as possible because the second transistor 252 is to be formed thereover.

In the above-described manner, the first transistor 250 can be formed (see FIG. 15D). Although not illustrated, it is also possible to employ a multilayer wiring structure.

Alternatively, a multilayer structure may be employed in which a plurality of transistors formed using the first semiconductor material and/or a plurality of transistors formed using the second semiconductor material are stacked.

Next, a manufacturing method of the second transistor 252 will be described.

Figure 16A:
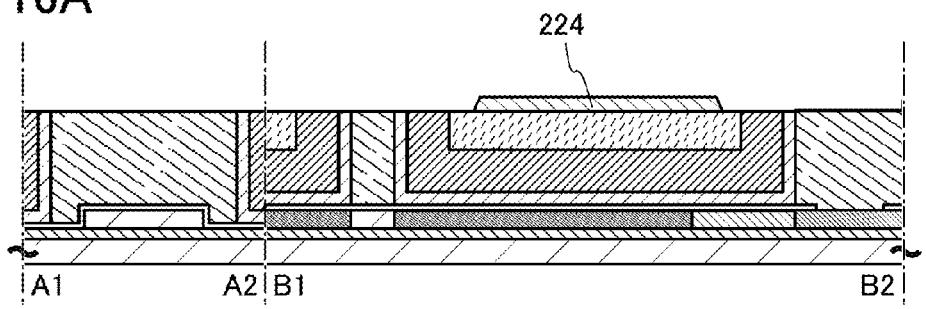
FIGS. 16A to 16D illustrate a manufacturing method of a storage device of one embodiment of the present invention.

First, an oxide semiconductor layer is formed over the gate electrode 208a, the first conductive layer 208b, the first insulating layer 216, the second insulating layer 218, the third insulating layer 220, and the like and is processed, so that the oxide semiconductor layer 224 is formed (see FIG. 16A). Note that an insulating layer functioning as a base may be formed over the first insulating layer 216, the second insulating layer 218, and the third insulating layer 220 before the oxide semiconductor layer is formed. Although a material and a formation method of the insulating layer are not particularly limited, the insulating layer can be formed, for example, by a sputtering method, a CVD method, or the like using silicon oxide, silicon oxinitride, or the like. Note that, as described below, the insulating layer functioning as a base preferably contains oxygen in a proportion higher than that in the stoichiometric composition.

As a material of the oxide semiconductor layer 224, for example, the following can be used: indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn and there is no particular limitation on the ratio of In, Ga, and Zn. The In—Ga—Z-based oxide may contain another metal element in addition to In, Ga, and Zn.

The oxide semiconductor layer is preferably formed by a method in which hydrogen, water, a hydroxyl group, hydride, and the like do not enter the oxide semiconductor layer. For example, a sputtering method can be employed.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions can be used. Note that one embodiment of the present invention is not limited thereto.

The sputtering method may be performed in a rare gas atmosphere, an oxygen atmosphere, or a mixed gas atmosphere of a rare gas and oxygen. Moreover, it is preferable to use a high-purity gas from which hydrogen, water, a hydroxyl group, a hydride, and the like are sufficiently removed so that the entry of hydrogen, water, a hydroxyl group, a hydride, and the like into the oxide semiconductor layer can be prevented.

The thickness of the oxide semiconductor layer 224 is preferably greater than or equal to 3 nm and less than or equal to 30 nm. This is because the transistor might be normally on when the oxide semiconductor layer 224 is too thick (e.g., the thickness is 50 nm or more).

A specific example of a formation method of the oxide semiconductor layer will be described.

First, a substrate is put in a process chamber, and heating is performed so that the substrate temperature becomes higher than 200° C. and lower than or equal to 500° C., preferably higher than 300° C. and lower than or equal to 500° C., more preferably higher than or equal to 350° C. and lower than or equal to 450° C.

Note that before the oxide semiconductor layer is formed by a sputtering method, powdery substances or the like attached on a surface on which the oxide semiconductor layer is to be formed are preferably removed by reverse sputtering in which an argon gas is introduced into the process chamber and plasma is generated. Note that instead of an argon gas, a nitrogen gas, a helium gas, an oxygen gas, or the like may be used.

Before or after the processing of the oxide semiconductor layer (as first heat treatment), or after the formation of the gate insulating layer 226, the oxide semiconductor layer is preferably subjected to heat treatment. The heat treatment is performed in an inert gas atmosphere at higher than or equal to 250° C. and lower than or equal to 700° C., preferably higher than or equal to 450° C. and lower than or equal to 600° C. The substrate temperature is set lower than the strain point of the substrate. The heat treatment may be performed either once or a plurality of times. The heat treatment is performed in order to dehydrate and dehydrogenate the oxide semiconductor layer; through the heat treatment, the crystal structure of the oxide semiconductor layer 224 can be ordered and defect levels in an energy gap can be reduced.

Here, the crystallinity of the oxide semiconductor layer 224 will be described. The oxide semiconductor layer 224 may be single-crystalline, polycrystalline, or amorphous. The oxide semiconductor layer 224 is preferably a c-axis aligned crystalline oxide semiconductor (CAAC-OS) layer.

The CAAC-OS layer is not completely single-crystalline nor completely amorphous. The CAAC-OS layer is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and the crystal part in the CAAC-OS layer is not clear. Further, with the TEM, a grain boundary in the CAAC-OS layer is not found, which suggests that in the CAAC-OS layer, a reduction in electron mobility due to the grain boundary is suppressed, which is preferable.

In the crystal parts included in the CAAC-OS layer, c-axes are aligned in the direction parallel (including a range from −5° to 5°) to a normal vector of a surface where the CAAC-OS layer is formed or a normal vector of a surface of the CAAC-OS layer, triangular or hexagonal atomic arrangement which is seen from the direction perpendicular (including a range from 85° to 95°) to the a-b plane is formed, and metal atoms are arranged in a layered manner or metal atoms and oxygen atoms are arranged in a layered manner when seen from the direction perpendicular (including a range from 85° to 95°) to the c-axis. Note that, among the crystal parts, the directions of the a-axis and the b-axis of one crystal part may be different from those of another crystal part.

In the CAAC-OS layer, the distribution of the crystal parts does not necessarily have to be uniform. For example, in the formation process of the CAAC-OS layer, in the case where crystal growth occurs from the surface side of the oxide semiconductor film, the proportion of the crystal parts in the vicinity of the surface of the oxide semiconductor film is higher than that in the vicinity of the surface where the oxide semiconductor film is formed in some cases. Further, when an impurity is added to the CAAC-OS layer, the crystal part in a region to which the impurity is added becomes amorphous in some cases.

Since the c-axes of the crystal parts included in the CAAC-OS layer are aligned in the direction parallel (including a range from −5° to 5°) to a normal vector of a surface where the CAAC-OS layer is formed or a normal vector of a surface of the CAAC-OS layer, the directions of the c-axes may be different from each other depending on the shape of the CAAC-OS layer (the cross-sectional shape of the surface where the CAAC-OS layer is formed or the cross-sectional shape of the surface of the CAAC-OS layer). Note that the direction of the c-axis of the crystal portion is the direction parallel (including a range from −5° to 5°) to a normal vector of the surface where the CAAC-OS layer is formed or a normal vector of the surface of the CAAC-OS layer. The crystal part is formed by formation of the CAAC-OS layer or by performing treatment for crystallization such as heat treatment after the formation.

The use of the CAAC-OS layer in a transistor leads to a reduction in change in electric characteristics of the transistor due to irradiation with visible light or ultraviolet light. Thus, the use of the CAAC-OS layer leads to high reliability of the transistor.

The CAAC-OS layer is formed, for example, by a sputtering method using a polycrystalline oxide semiconductor sputtering target. When ions collide with the sputtering target, a crystal region included in the sputtering target may be separated from the target along an a-b plane, and sputtered particles having planes parallel to an a-b plane (flat-plate-like sputtered particles or pellet-like sputtered particles) may flake off from the sputtering target. In this case, the flat-plate-like sputtered particles reach a substrate while maintaining their crystal states, whereby the CAAC-OS layer can be formed.

For the formation of the CAAC-OS layer, the following conditions are preferably used.

Reduction in amount of impurities entering the CAAC-OS layer during the deposition can prevent the crystal state from being broken by the impurities. For example, the concentration of impurities (e.g., hydrogen, water, carbon dioxide, or nitrogen) existing in a deposition chamber is preferably reduced. Furthermore, the concentration of impurities in a deposition gas is preferably reduced. Specifically, a deposition gas whose dew point is −80° C. or lower, preferably −100° C. or lower is used.

When the substrate heating temperature during the deposition is increased, migration of sputtered particles occurs after the sputtered particles reach the substrate. Specifically, the substrate heating temperature during the deposition is higher than or equal to 100° C. and lower than or equal to 740° C., preferably higher than or equal to 200° C. and lower than or equal to 500° C. When the substrate heating temperature during the deposition is increased and the flat-plate-like sputtered particles reach the substrate, migration occurs over the substrate, and flat surfaces of the sputtered particles are attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based oxide target will be described below.

The In—Ga—Zn-based oxide target, which is polycrystalline, is made by mixing $InO_Z$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Directly after being formed, the oxide semiconductor layer is preferably supersaturated so that the proportion of oxygen is higher than that in the stoichiometric composition. For example, in the case where the oxide semiconductor layer is formed by a sputtering method, the deposition is preferably performed under the condition where the proportion of oxygen in a deposition gas is large, particularly in an oxygen atmosphere (oxygen gas: 100%). When the deposition is performed under the condition where the proportion of oxygen in a deposition gas is large, particularly in a 100% oxygen gas atmosphere, a release of Zn from the film can be controlled even at a deposition temperature higher than or equal to 300° C., for example.

Figure 16B:
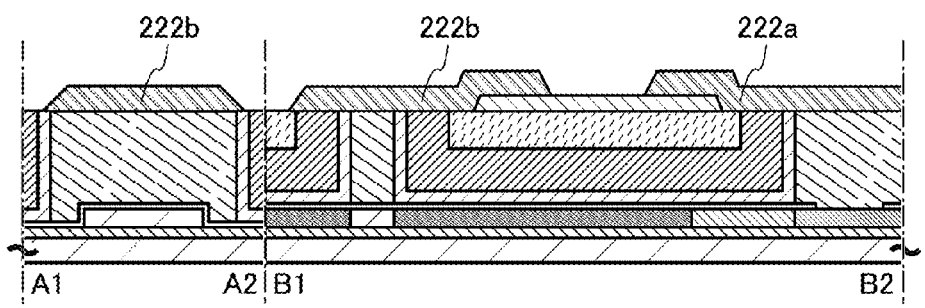

Next, a conductive layer is formed over the oxide semiconductor layer 224 and the like and is processed, so that the source electrode 222a and the drain electrode 222b are formed (see FIG. 16B). Here, there is no particular limitation on a material and a formation method of the conductive layer. Examples of a material of the conductive layer are metal materials such as aluminum, copper, titanium, tantalum, and tungsten, and polycrystalline silicon to which an impurity element imparting a conductivity type is added. Examples of a formation method of the conductive layer are an evaporation method, a CVD method, a sputtering method, and a spin coating method. Note that the conductive layer may be a single layer or a stack of a plurality of layers. Note that the conductive layer is preferably processed so that end portions of the source electrode 222a and the drain electrode 222b are tapered.

The channel length of the second transistor 252 depends on the distance between lower edges of the source electrode 222a and the drain electrode 222b. In the case where the second transistor 252 with a short channel length of, for example, less than 25 nm is formed, it is preferable to use extreme ultraviolet light whose wavelength is short in light exposure for formation of a mask used for processing. The short channel length facilitates miniaturization of an element; thus, the area occupied by the element can be reduced.

Note that although not illustrated, an oxide conductive layer may be provided between the oxide semiconductor layer 224 and the source and drain electrodes 222a and 222b. The oxide conductive layer functions as a source region and a drain region. A material of the oxide conductive layer preferably contains zinc oxide as a main component and preferably does not contain indium oxide as a main component. Examples of a material of the oxide conductive layer are zinc oxide, zinc aluminum oxide, zinc aluminum oxynitride, and zinc gallium oxide.

Note that a "main component" refers to an element contained in a composition at 5 atomic % or more.

The oxide conductive layer can be formed by processing an oxide conductive layer stacked over the oxide semiconductor layer or by processing a conductive layer stacked over the conductive layer that is to be the source electrode and the drain electrode.

When the oxide conductive layer is provided between the oxide semiconductor layer and the source and drain electrodes, the resistance between the source electrode and the drain electrode can be reduced, leading to high-speed operation of the second transistor 252. Further, the withstand voltage of the second transistor 252 can be increased. Furthermore, the frequency characteristics of a peripheral circuit such as a driver circuit can be improved.

Figure 16C:
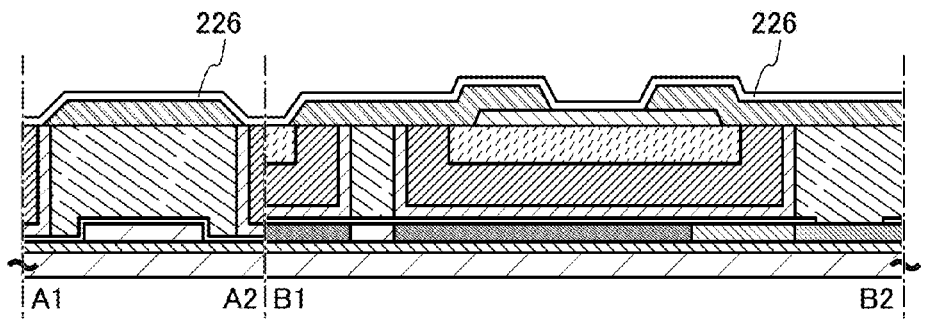

Next, the gate insulating layer 226 is formed in contact with part of the oxide semiconductor layer 224 so as to cover the source electrode 222a and the drain electrode 222b (see FIG. 16C).

The gate insulating layer 226 is preferably formed to have a single-layer or layered structure including any of silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) which contains nitrogen, hafnium aluminate ($HfAl_xO_y$ (x>0, y>0)) which contains nitrogen, and the like. The gate insulating layer 226 can also be formed using gallium oxide. In the case where the gate insulating layer 226 is formed using silicon oxide, the thickness of the gate insulating layer 226 is preferably greater than or equal to 1 nm and less than or equal to 100 nm, more preferably greater than or equal to 10 nm and less than or equal to 50 nm. A CVD method, a sputtering method, or the like may be employed for formation of the gate insulating layer 226. However, one embodiment of the present invention is not limited thereto.

Although the gate insulating layer 226 is preferably thin (within the above range), a reduction in thickness of the gate insulating layer 226 causes a problem of gate leakage due to a tunnel effect or the like. Thus, a high dielectric constant (high-k) material is preferably used as a material of the gate insulating layer 226. Examples of the high dielectric constant material are hafnium oxide, tantalum oxide, yttrium oxide, hafnium silicate ($HfSi_xO_y$ (x>0, y>0)), hafnium silicate to which nitrogen is added ($HfSi_xO_y$ (x>0, y>0)), hafnium aluminate ($HfAl_xO_y$ (x>0, y>0)), and hafnium aluminate to which nitrogen is added ($HfAl_xO_y$ (x>0, y>0)). Note that the gate insulating layer 226 may have a layered structure of a layer containing a high-k material and a layer containing any of silicon oxide, silicon nitride, silicon oxynitride, silicon nitride oxide, aluminum oxide, and the like.

The gate insulating layer 226 can be formed using an insulating material containing a Group 13 element. The use of an insulating material containing a Group 13 element for the gate insulating layer 226 makes it possible to suppress generation of interface levels between the oxide semiconductor layer 224 and the gate insulating layer 226 and achieve favorable characteristics of the interface.

Further, it is preferable that the gate insulating layer 226 contain oxygen in a proportion higher than that in the stoichiometric composition not only at a surface of the gate insulating layer 226 but also inside the gate insulating layer 226. Introduction of oxygen can be performed by heat treatment in an oxygen atmosphere or by oxygen doping. The oxygen doping may be performed by an ion implantation method or an ion doping method.

Such an insulating layer which contains oxygen in a proportion higher than that in the stoichiometric composition is also preferably used as an insulating layer formed as a base of the oxide semiconductor layer 224.

In the case where the gate insulating layer 226 contains oxygen in a proportion higher than that in the stoichiometric composition, it is particularly preferable to perform heat treatment after the formation of the gate insulating layer 226. The temperature for second heat treatment is higher than or equal to 200° C. and lower than or equal to 450° C., preferably higher than or equal to 250° C. and lower than or equal to 350° C. When the heat treatment is performed at a temperature in the above range, oxygen contained in the gate insulating layer 226 can be sufficiently supplied to the oxide semiconductor layer, so that defect levels in an energy gap due to oxygen vacancies can be reduced.

Figure 16D:
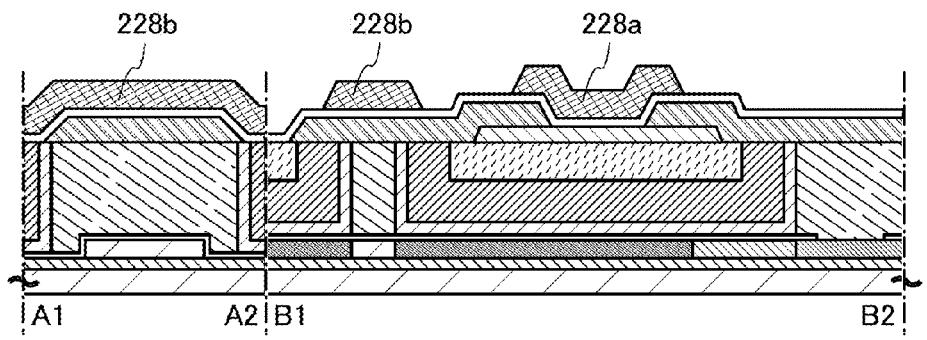

Next, a conductive layer for forming the gate electrode is formed and is processed, so that the gate electrode 228a and the second conductive layer 228b are formed (see FIG. 16D). Here, there is no particular limitation on a material and a formation method of the conductive layer. Examples of a material of the conductive layer are metal materials such as aluminum, copper, titanium, tantalum, and tungsten, and polycrystalline silicon to which an impurity element imparting a conductivity type is added. Examples of a formation method of the conductive layer are an evaporation method, a CVD method, a sputtering method, and a spin coating method. Note that the conductive layer may be a single layer or a stack of a plurality of layers.

Figure 17A:
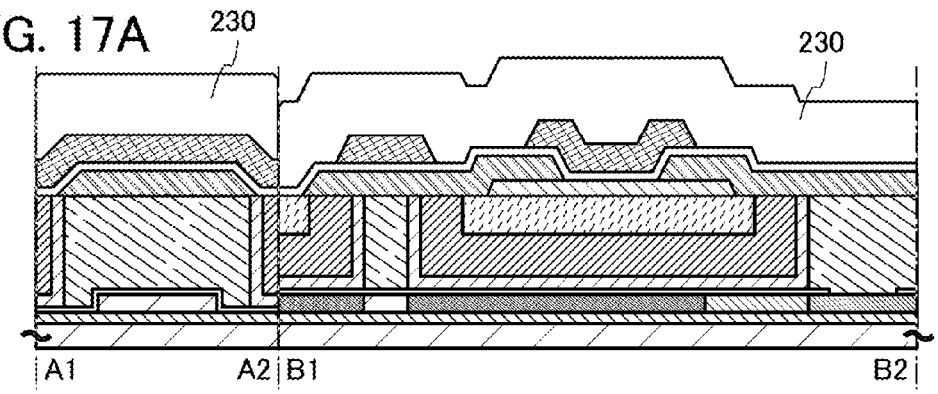
FIGS. 17A to 17C illustrate a manufacturing method of a storage device of one embodiment of the present invention.

Then, the fourth insulating layer 230 is formed over the gate insulating layer 226, the gate electrode 228a, and the second conductive layer 228b (see FIG. 17A). Examples of a material of the fourth insulating layer 230 are silicon oxide, silicon oxynitride, silicon nitride, hafnium oxide, gallium oxide, and aluminum oxide.

Note that for the fourth insulating layer 230, a material with a low dielectric constant or a porous structure with a low dielectric constant is preferably used. This is because when the dielectric constant of the fourth insulating layer 230 is low, parasitic capacitance between a plurality of wirings or electrodes can be reduced, leading to higher speed operation. Note that although the fourth insulating layer 230 has a single-layer structure in this embodiment, one embodiment of the present invention is not limited to this; the fourth insulating layer 230 may be a stack of a plurality of layers. The fourth insulating layer 230 can be formed by a PVD method, a CVD method, or the like.

Figure 17B:
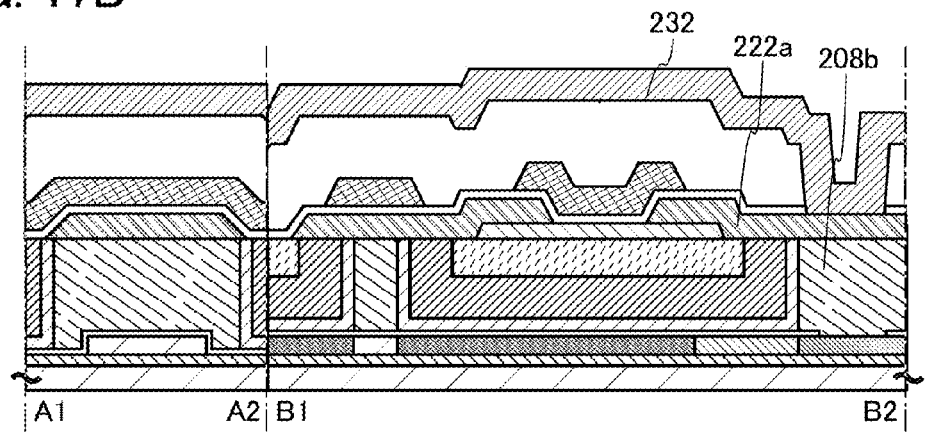

After that, an opening which reaches the source electrode 222a is formed in the gate insulating layer 226 and the fourth insulating layer 230 by etching or the like, and the wiring 232 is formed over the fourth insulating layer 230 so as to be connected to the source electrode 222a (see FIG. 17B).

Examples of a material of the wiring 232 are metal materials such as aluminum, copper, titanium, tantalum, and tungsten, and polycrystalline silicon to which an impurity element imparting a conductivity type is added. Examples of a formation method of the wiring 232 are an evaporation method, a CVD method, a sputtering method, and a spin coating method. Note that the conductive layer may be a single layer or a stack of a plurality of layers.

The wiring 232 is preferably formed in such a manner that a titanium layer is formed to a thickness of approximately 5 nm in a portion of the fourth insulating layer 230 in which the opening is formed by a PVD method, and then, an aluminum layer is formed so as to be embedded in the opening. The titanium layer allows reduction of a natural oxide film having a surface over which the titanium layer is formed, or the like, a decrease in contact resistance between the source electrode 222a and the wiring 232, and prevention of hillocks of the aluminum layer.

The opening in the fourth insulating layer 230 is preferably formed in a portion overlapping with the first conductive layer 208b. This is because an increase in element area due to a contact region can be controlled, leading to higher integration of the storage device.

Figure 17C:
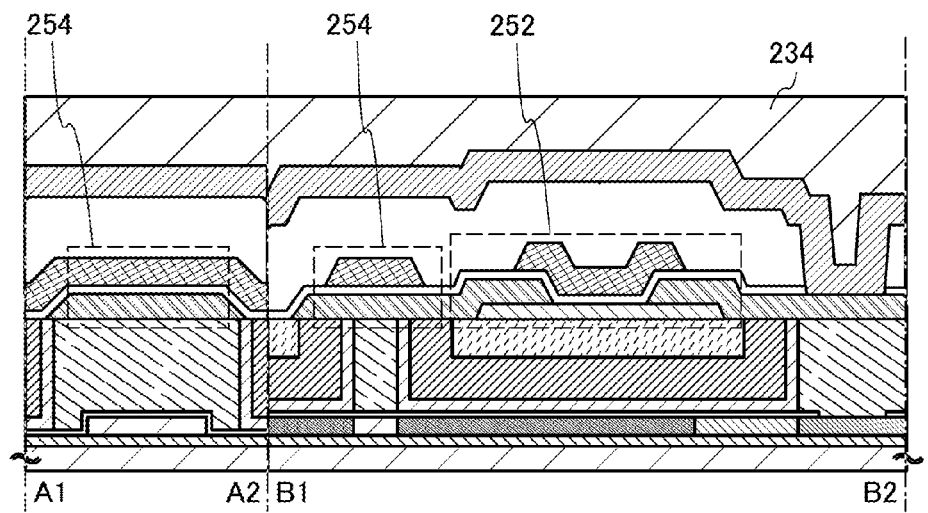

Then, a fifth insulating layer 234 is formed so as to cover the wiring 232, so that the second transistor 252 and the capacitor 254 can be formed (see FIG. 17C).

In the above-described manner, the storage device illustrated in FIGS. 12A and 12B can be manufactured.

(Embodiment 3)

Next, electronic devices of embodiments of the present invention will be described. The storage devices described in Embodiment 1 or 2 are mounted on the electronic devices of embodiments of the present invention. As the electronic devices of embodiments of the present invention, the following can be given, for example: a computer, a mobile phone handset (also referred to as a mobile phone or a mobile phone device), a portable information terminal (including a portable game console, an audio player, and the like), cameras such as a digital camera and a digital video camera, an electronic paper, and a television device (also referred to as a television or a television receiver). The storage devices described in Embodiment 1 or 2 can be provided for storage portions of the above electronic devices, for example.

Figure 18A:
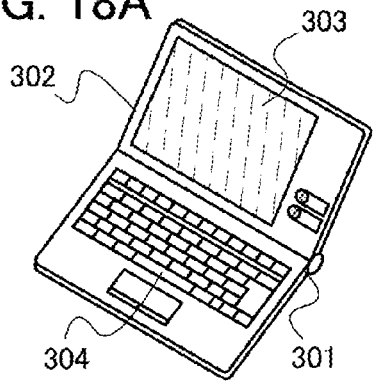
FIGS. 18A to 18F each illustrate an electronic device on which a storage device of one embodiment of the present invention is mounted.

FIG. 18A illustrates a laptop personal computer which includes a housing 301, a housing 302, a display portion 303, a keyboard 304, and the like. The storage devices described in Embodiments 1 or 2 is provided in the housings 301 and 302.

Figure 18D:
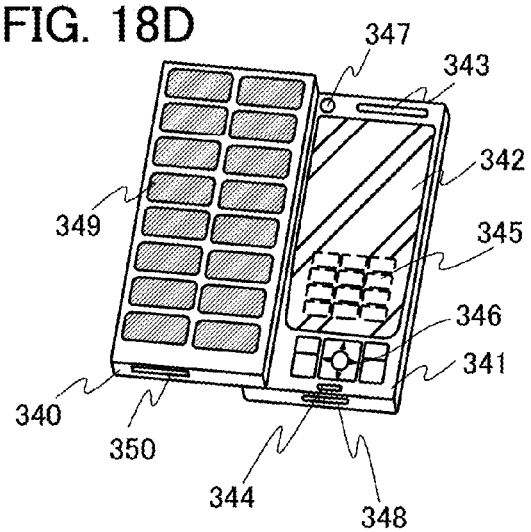
Figure 18B:
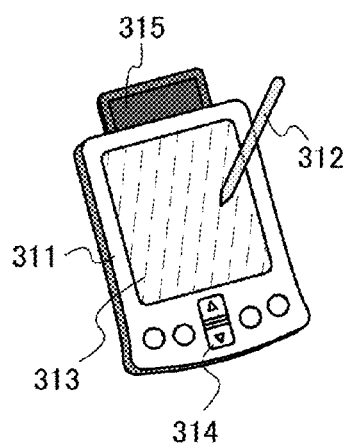

FIG. 18B illustrates a portable information terminal (PDA) which includes a display portion 313, an external interface 315, an operation button 314, and the like in a main body 311. Further, a stylus 312 for operating the portable information terminal, or the like is provided. The storage device described in Embodiment 1 or 2 is provided in the main body 311.

Figure 18E:
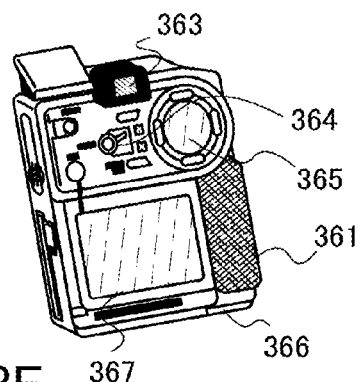
Figure 18C:
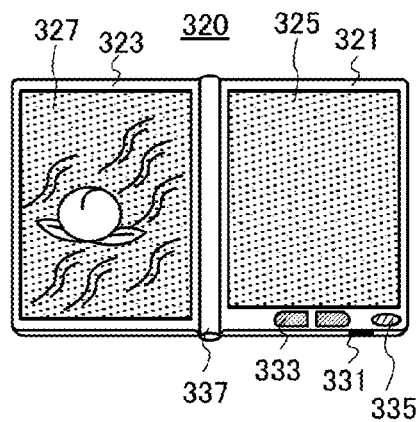

FIG. 18C illustrates an e-book reader 320 including electronic paper. The e-book reader 320 includes two housings of a housing 321 and a housing 323. The housing 321 and the housing 323 include a display portion 325 and a display portion 327, respectively. The housing 321 is combined with the housing 323 by a hinge 337, so that the e-book reader 320 can be opened and closed using the hinge 337 as an axis. The housing 321 is provided with a power switch 331, operation keys 333, a speaker 335, and the like. At least one of the housing 321 and the housing 323 is provided with the storage device described in Embodiment 1 or 2.

FIG. 18D illustrates a mobile phone which includes two housings of a housing 340 and a housing 341. Moreover, the housings 340 and 341 unfolded as illustrated in FIG. 18D can be slid so that one overlaps with the other; therefore, the size of the mobile phone can be reduced, which makes the mobile phone suitable for being carried. The housing 341 includes a display panel 342, a speaker 343, a microphone 344, a pointing device 346, a camera lens 347, an external connection terminal 348, and the like. The housing 340 is provided with a solar cell 349 for charging the mobile phone, an external memory slot 350, and the like. In addition, an antenna is incorporated in the housing 341. At least one of the housing 340 and the housing 341 is provided with the storage device described in Embodiment 1 or 2.

FIG. 18E illustrates a digital camera which includes a main body 361, a display portion 367, an eyepiece 363, an operation switch 364, a display portion 365, a battery 366, and the like. The storage device described in Embodiment 1 or 2 is provided in the main body 361.

Figure 18F:
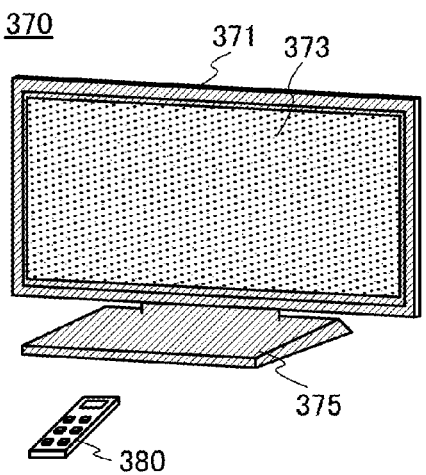

FIG. 18F is a television set 370 which includes a housing 371, a display portion 373, a stand 375, and the like. The television set 370 can be operated by a switch included in the housing 371 or by a remote controller 380. In the housing 371 or the remote controller 380, the storage device described in Embodiment 1 or 2 is provided.

This application is based on Japanese Patent Application serial no. 2011-264742 filed with the Japan Patent Office on Dec. 2, 2011, the entire contents of which are hereby incorporated by reference.

What is claimed is:

1. A driving method of a storage device comprising a first memory cell and a second memory cell, wherein the first memory cell comprises a first transistor, a second transistor, and a first capacitor, wherein one of a source and a drain of the first transistor is electrically connected to a first bit line, wherein the other of the source and the drain of the first transistor is electrically connected to a first source line, wherein one of a source and a drain of the second transistor is electrically connected to a gate of the first transistor, wherein the other of the source and the drain of the second transistor is electrically connected to the first bit line, wherein a first electrode of the first capacitor is electrically connected to the gate of the first transistor, wherein the second memory cell comprises a third transistor, a fourth transistor, and a second capacitor, wherein one of a source and a drain of the third transistor is electrically connected to a second bit line, wherein the other of the source and the drain of the third transistor is electrically connected to a second source line, wherein one of a source and a drain of the fourth transistor is electrically connected to a gate of the third transistor, wherein the other of the source and the drain of the fourth transistor is electrically connected to the second bit line, and wherein a first electrode of the second capacitor is electrically connected to the gate of the third transistor, the driving method comprising the steps of:
supplying a first potential to the first source line;
supplying a second potential to the first bit line;
electrically isolating the first bit line after supplying the second potential to the first bit line;
changing a potential of a second electrode of the first capacitor from a third potential to a fourth potential so that the first potential or the second potential is supplied to the first bit line;
supplying a fifth potential lower than the second potential to the second bit line;
supplying a sixth potential or a seventh potential to the first bit line in accordance with the potential of the first bit line; and
turning on a switch provided between the first bit line and an input-output line to read out data of the first bit line.

2. The driving method according to claim 1,
wherein the sixth potential is higher than the second potential, and
wherein the seventh potential is equal to or lower than the first potential.

3. The driving method according to claim 1,
wherein the first potential, the fourth potential, and the seventh potential are equal to one another,
wherein the third potential is equal to the sixth potential, and
wherein the second potential is higher than the first potential and lower than the third potential.

4. The driving method according to claim 3,
wherein the first potential is a ground potential, and
wherein the third potential is a power supply potential.

5. The driving method according to claim 1,
wherein the second transistor comprises a channel formation region comprising an oxide semiconductor.

6. The driving method according to claim 5,
wherein an off-state current of the second transistor is 100 zA or less at 25° C.

7. A driving method of a storage device comprising a first memory cell and a sense amplifier, wherein the first memory cell comprises a first transistor, a second transistor, and a first capacitor, wherein one of a source and a drain of the first transistor is electrically connected to a first bit line, wherein the other of the source and the drain of the first transistor is electrically connected to a first source line, wherein one of a source and a drain of the second transistor is electrically connected to a gate of the first transistor, wherein the other of the source and the drain of the second transistor is electrically connected to the first bit line, wherein a first electrode of the first capacitor is electrically connected to the gate of the first transistor, and wherein the first bit line is electrically connected to the sense amplifier, the driving method comprising the steps of:
supplying a first potential to the first bit line;
electrically isolating the first bit line after supplying the first potential to the first bit line;
changing a potential of a second electrode of the first capacitor so that a signal is output to the first bit line in accordance with a voltage held in the first capacitor;
amplifying the signal by the sense amplifier; and reading out the amplified signal through a switch from the first bit line to an input-output line by turning on the switch.

8. The driving method according to claim 7, wherein the storage device further comprises a second memory cell, wherein the second memory cell comprises a third transistor, a fourth transistor, and a second capacitor, wherein one of a source and a drain of the third transistor is electrically connected to a second bit line, wherein the other of the source and the drain of the third transistor is electrically connected to a second source line, wherein one of a source and a drain of the fourth transistor is electrically connected to a gate of the third transistor, wherein the other of the source and the drain of the fourth transistor is electrically connected to the second bit line, wherein a first electrode of the second capacitor is electrically connected to the gate of the third transistor, and wherein the second bit line is electrically connected to the sense amplifier, the driving method further comprising the steps of:
supplying a second potential to the second bit line before amplifying the signal by the sense amplifier.

9. The driving method according to claim 7, wherein the second transistor comprises a channel formation region comprising an oxide semiconductor.

10. The driving method according to claim 9, wherein an off-state current of the second transistor is 100 zA or less at 25° C.

11. A driving method of a storage device comprising a first memory cell and a second memory cell, wherein the first memory cell comprises a first transistor, a second transistor, and a first capacitor, wherein one of a source and a drain of the first transistor is electrically connected to a first bit line, wherein the other of the source and the drain of the first transistor is electrically connected to a first source line, wherein one of a source and a drain of the second transistor is electrically connected to a gate of the first transistor, wherein the other of the source and the drain of the second transistor is electrically connected to the first bit line, wherein a first electrode of the first capacitor is electrically connected to the gate of the first transistor, wherein the second memory cell comprises a third transistor, a fourth transistor, and a second capacitor, wherein one of a source and a drain of the third transistor is electrically connected to a second bit line, wherein the other of the source and the drain of the third transistor is electrically connected to a second source line, wherein one of a source and a drain of the fourth transistor is electrically connected to a gate of the third transistor, wherein the other of the source and the drain of the fourth transistor is electrically connected to the second bit line, and wherein a first electrode of the second capacitor is electrically connected to the gate of the third transistor, the driving method comprising the steps of:
supplying a first potential to the first source line;
supplying a second potential to the first bit line;
electrically isolating the first bit line after supplying the second potential to the first bit line;
changing a potential of a second electrode of the first capacitor from a third potential to a fourth potential so that the first potential or the second potential is supplied to the first bit line;
supplying a fifth potential lower than the second potential to the second bit line;
turning on a switch provided between the first bit line and an input-output line so that a sixth potential or a seventh potential is supplied to the first bit line, whereby data is written to the first memory cell; and
turning off the second transistor after turning on the switch.

12. The driving method according to claim 11, wherein the sixth potential is higher than the second potential, and
wherein the seventh potential is equal to or lower than the first potential.

13. The driving method according to claim 11, wherein the first potential, the fourth potential, and the seventh potential are equal to one another,
wherein the third potential is equal to the sixth potential, and
wherein the second potential is higher than the first potential and lower than the third potential.

14. The driving method according to claim 13, wherein the first potential is a ground potential, and
wherein the third potential is a power supply potential.

15. The driving method according to claim 11, wherein the second transistor comprises a channel formation region comprising an oxide semiconductor.

16. The driving method according to claim 15, wherein an off-state current of the second transistor is 100 zA or less at 25° C.

17. A driving method of a storage device comprising a first memory cell, a second memory cell, and a sense amplifier, wherein the first memory cell comprises a first transistor, a second transistor, and a first capacitor, wherein one of a source and a drain of the first transistor is electrically connected to a first bit line, wherein the other of the source and the drain of the first transistor is electrically connected to a first source line, wherein one of a source and a drain of the second transistor is electrically connected to a gate of the first transistor, wherein the other of the source and the drain of the second transistor is electrically connected to the first bit line, wherein a first electrode of the first capacitor is electrically connected to the gate of the first transistor, wherein the first bit line is electrically connected to the sense amplifier, wherein the second memory cell comprises a third transistor, a fourth transistor, and a second capacitor, wherein one of a source and a drain of the third transistor is electrically connected to a second bit line, wherein the other of the source and the drain of the third transistor is electrically connected to a second source line, wherein one of a source and a drain of the fourth transistor is electrically connected to a gate of the third transistor, wherein the other of the source and the drain of the fourth transistor is electrically connected to the second bit line, wherein a first electrode of the second capacitor is electrically connected to the gate of the third transistor, and wherein the second bit line is electrically connected to the sense amplifier, the driving method comprising the steps of:
turning on the second transistor;
inputting a first signal through a first switch from a first input-output line to the first bit line by turning on the first switch;
inputting a second signal through a second switch from a second input-output line to the second bit line by turning on the second switch; and
turning off the second transistor after inputting the first signal and the second signal,
wherein the first signal and the second signal are amplified by the sense amplifier.

18. The driving method according to claim 17, wherein the second transistor comprises a channel formation region comprising an oxide semiconductor.

19. The driving method according to claim 18, wherein an off-state current of the second transistor is 100 zA or less at 25° C.

20. A storage device comprising:
a first storage portion;

a second storage portion;
a first switch,
a second switch,
a first driver circuit, and
a second driver circuit,
wherein in each of the first storage portion and the second storage portion, a plurality of storage elements is arranged in a matrix,
wherein the first storage portion is electrically connected to the first switch,
wherein the second storage portion is electrically connected to the second switch,
wherein the first driver circuit comprises is two precharge switches and one sense amplifier,
wherein in each of the plurality of storage elements, a node electrically connected to a source or a drain of a first transistor is a memory storing portion, and
wherein the first transistor comprises a first channel formation region comprising an oxide semiconductor.

21. The storage device according to claim 20,
wherein an off-state current of the first transistor is 100 zA or less at 25° C.

22. The storage device according to claim 20,
wherein each of the plurality of storage elements comprises a second transistor,
wherein a gate of the second transistor is electrically connected to the node, and
wherein the second transistor comprises a second channel formation region comprising single crystal silicon.

23. A storage device comprising:
a first memory cell comprising:
    a first transistor;
    a second transistor; and
    a first capacitor;
a second memory cell comprising:
    a third transistor;
    a fourth transistor; and
    a second capacitor; and
a sense amplifier comprising:
    a fifth transistor;
    a sixth transistor;
    a seventh transistor; and
    an eighth transistor,
wherein one of a source and a drain of the first transistor is electrically connected to a first bit line,
wherein the other of the source and the drain of the first transistor is electrically connected to a first source line,
wherein one of a source and a drain of the second transistor is electrically connected to a gate of the first transistor,
wherein the other of the source and the drain of the second transistor is electrically connected to the first bit line,
wherein a first electrode of the first capacitor is electrically connected to the gate of the first transistor,
wherein the first bit line is electrically connected to the sense amplifier,
wherein one of a source and a drain of the third transistor is electrically connected to a second bit line,
wherein the other of the source and the drain of the third transistor is electrically connected to a second source line,
wherein one of a source and a drain of the fourth transistor is electrically connected to a gate of the third transistor,
wherein the other of the source and the drain of the fourth transistor is electrically connected to the second bit line,
wherein a first electrode of the second capacitor is electrically connected to the gate of the third transistor,
wherein the second bit line is electrically connected to the sense amplifier,
wherein one of a source and a drain of the fifth transistor is electrically connected to the first bit line,
wherein a gate of the fifth transistor is electrically connected to the second bit line,
wherein one of a source and a drain of the sixth transistor is electrically connected to the first bit line,
wherein a gate of the sixth transistor is electrically connected to the second bit line,
wherein one of a source and a drain of the seventh transistor is electrically connected to the second bit line,
wherein a gate of the seventh transistor is electrically connected to the first bit line,
wherein one of a source and a drain of the eighth transistor is electrically connected to the second bit line, and
wherein a gate of the eighth transistor is electrically connected to the first bit line.

24. The storage device according to claim 23,
wherein the second transistor comprises a channel formation region comprising an oxide semiconductor.

25. The storage device according to claim 24,
wherein an off-state current of the second transistor is 100 zA or less at 25° C.

* * * * *